(12) United States Patent
Liao et al.

(10) Patent No.: US 11,721,884 B2
(45) Date of Patent: Aug. 8, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Guo-Cheng Liao, Kaohsiung (TW); Yi Chuan Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 179 days.

(21) Appl. No.: 17/222,875

(22) Filed: Apr. 5, 2021

(65) Prior Publication Data

US 2021/0226317 A1 Jul. 22, 2021

Related U.S. Application Data

(63) Continuation of application No. 16/375,640, filed on Apr. 4, 2019, now Pat. No. 10,971,798.

(60) Provisional application No. 62/747,580, filed on Oct. 18, 2018.

(51) Int. Cl.
*H01Q 1/22* (2006.01)
*H01Q 1/38* (2006.01)
*H01L 21/48* (2006.01)
*H01L 23/498* (2006.01)
*H01L 23/66* (2006.01)

(52) U.S. Cl.
CPC .......... *H01Q 1/2283* (2013.01); *H01L 21/48* (2013.01); *H01L 21/4853* (2013.01); *H01L 23/498* (2013.01); *H01L 23/49816* (2013.01); *H01L 23/66* (2013.01); *H01Q 1/22* (2013.01); *H01Q 1/38* (2013.01); *H01L 2223/6677* (2013.01)

(58) Field of Classification Search
CPC .......... H01Q 1/2283; H01Q 1/38; H01Q 1/22; H01L 21/4853; H01L 23/49816; H01L 2223/6677; H01L 23/66; H01L 23/498; H01L 21/48
USPC ....................................................... 343/720
See application file for complete search history.

(56) References Cited

U.S. PATENT DOCUMENTS

| | | |
|---|---|---|
| 8,063,846 B2 | 11/2011 | Imaoka et al. |
| 8,502,735 B1 | 8/2013 | Moosbrugger et al. |
| 9,620,464 B2 | 4/2017 | Baks et al. |
| 9,984,985 B1 | 5/2018 | Chiang et al. |
| 2006/0176211 A1 | 8/2006 | Mohamadi |

(Continued)

OTHER PUBLICATIONS

Non-Final Office Action for U.S. Appl. No. 16/375,640, dated Aug. 19, 2020, 17 pages.

(Continued)

*Primary Examiner* — Hai V Tran
(74) *Attorney, Agent, or Firm* — Foley & Lardner LLP

(57) ABSTRACT

A semiconductor device package is provided that includes a substrate, a first support structure disposed on the substrate and a first antenna. The first support structure includes a first surface spaced apart from the substrate by a first distance. The first antenna is disposed above the first surface of the first support structure. The first antenna has a first surface, a second surface opposite the first surface and a third surface extending from the first surface to the second surface, wherein the first surface and the second surface of the first antenna are exposed.

12 Claims, 28 Drawing Sheets

(56) References Cited

U.S. PATENT DOCUMENTS

| | | |
|---|---|---|
| 2007/0200768 A1 | 8/2007 | Goldberger |
| 2008/0231518 A1 | 9/2008 | Tsutsumi et al. |
| 2012/0212384 A1 | 8/2012 | Kam et al. |
| 2013/0292808 A1* | 11/2013 | Yen ....................... H01L 21/561 |
| | | 257/E23.114 |
| 2016/0049723 A1* | 2/2016 | Baks .................... H01Q 9/0457 |
| | | 343/848 |
| 2016/0056544 A1* | 2/2016 | Garcia ................. H01Q 9/0407 |
| | | 343/725 |
| 2017/0040266 A1* | 2/2017 | Lin ..................... H01L 23/5385 |
| 2019/0173184 A1* | 6/2019 | Kim ................. G06K 19/07775 |
| 2019/0221917 A1* | 7/2019 | Kim ..................... H01Q 1/2283 |

OTHER PUBLICATIONS

Notice of Allowance for U.S. Appl. No. 16/375,640, dated Dec. 2, 2020, 9 pages.

* cited by examiner

SEMICONDUCTOR DEVICE PACKAGE AND METHOD OF MANUFACTURING THE SAME

CROSS-REFERENCE TO RELATED APPLICATIONS

This application is a continuation of U.S. patent application Ser. No. 16/375,640 filed Apr. 4, 2019, which claims the benefit of U.S. Provisional Application No. 62/747,580, filed Oct. 18, 2018, the contents of which are incorporated herein by reference in their entirety.

BACKGROUND

1. Technical Field

The present disclosure relates generally to a semiconductor device package and a method of manufacturing the same.

2. Description of the Related Art

Wireless communication devices, such as mobile phones, may include semiconductor device package(s) having antennas for signal (e.g., radio frequency (RF) signal) transmission. As working frequency increases (e.g., equal to or greater than 5 GHz), signal attenuation or signal loss of the RF signal can be worse. Antenna(s) may be disposed adjacent to a dielectric layer and characteristic of the dielectric layer may affect performance of the antenna.

SUMMARY

An antenna structure and its manufacturing process are proposed. In the proposed antenna structure, at least two surfaces of the antenna structure are not covered by protection layer or dielectric layer. A supporting structure having a step structure on which the antenna structure is disposed is proposed.

In one or more embodiments, a semiconductor device package is provided. The semiconductor device package includes a substrate and a first support structure disposed on the substrate and having a first surface spaced apart from the substrate by a first distance. The semiconductor device package further includes a first antenna disposed above the first surface of the first support structure, the first antenna having a first surface, a second surface opposite the first surface and a third surface extending from the first surface to the second surface. Wherein the first surface and the second surface of the first antenna are exposed.

In one or more embodiments, a method of manufacturing a semiconductor device package is provided. The method includes: (a) providing a carrier; (b) forming an antenna pattern on the carrier; (c) forming a dielectric layer on the carrier to cover the antenna pattern; (d) removing a portion of the dielectric layer to expose a top surface of the antenna pattern; and (e) exposing a bottom surface of the antenna pattern.

In one or more embodiments, a method of manufacturing a semiconductor device package is provided. The method includes: (a) providing a substrate having an antenna and a feeding element disposed on a first surface of the substrate; (b) forming a first protection layer on the substrate to cover the antenna and the feeding element; (c) forming an opening on the first protection layer to expose the antenna and a portion of the feeding element; and (d) forming a conductive via in the opening.

BRIEF DESCRIPTION OF THE DRAWINGS

Aspects of the present disclosure are readily understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
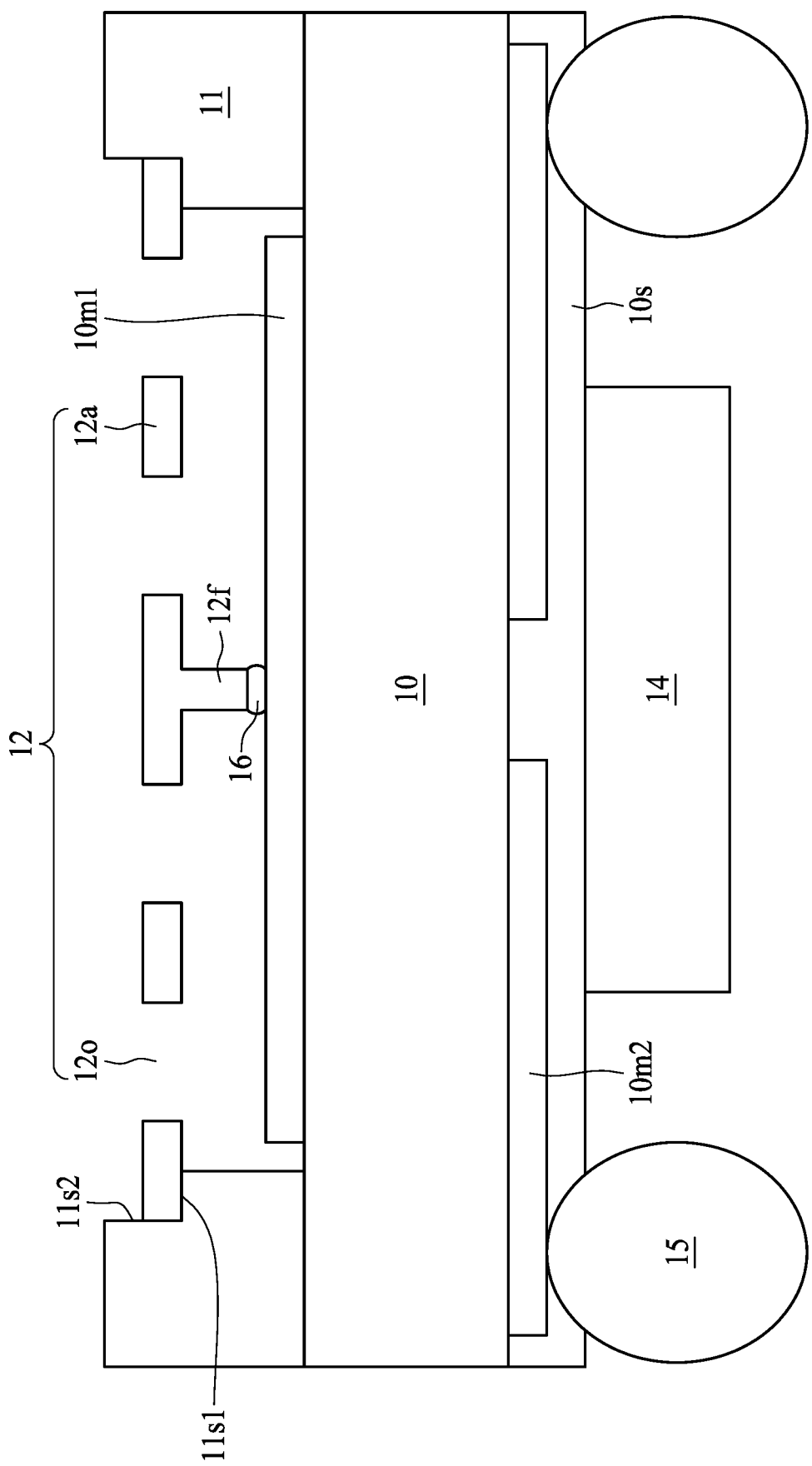
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package in accordance with some embodiments of the present disclosure. The semiconductor device package includes a substrate 10, a support structure 11, an antenna 12, an electronic component 14 and electrical contacts 15.

The substrate 10 may be, for example, a printed circuit board, such as a paper-based copper foil laminate, a composite copper foil laminate, or a polymer-impregnated glass-fiber-based copper foil laminate. The substrate 10 may include opposite surfaces (e.g., a top surface and a bottom surface). The substrate 10 may include an interconnection structure (e.g., an electrical connection), such as a redistribution layer (RDL). The substrate 10 may include metal layers $10m1$ and $10m2$ respectively on its top surface and bottom surface. In some embodiments, the metal layer $10m1$ is a grounding layer.

The support structure 11 disposed on the top surface of the substrate 10. In some embodiments, the support structure 11 can be formed of or includes insulation materials. In some embodiments, the support structure 11 is formed of or includes photo sensitive materials, such as photo-imageable dielectric (PID).

In some embodiments, the support structure 11 is formed of or includes a dielectric material. For example, the support structure 11 may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets.

Referring to FIG. 1A, the support structure 11 includes a step structure (or ladder structure) defined by surfaces $11s1$ and $11s2$. The surfaces $11s1$ and $11s2$ are connected to each other. The surface $11s1$ is spaced apart from the top surface of the substrate 10 by a distance. In some embodiments, the number of the step structures can be changed depending on design specifications. For example, there may be number of N step structures, wherein N is an integer equal to or greater than 1.

The antenna 12 may be disposed on the step structure of the support structure 11. The antenna 12 is disposed on the surface $11s1$ of the support structure 11. In some embodiments, the antenna 12 includes an antenna pattern $12a$ and an opening $12o$. In some embodiments, the antenna 12 can be integrated formed without any openings. In some embodiments, a lateral surface of the antenna 12 is in contact with the surface $11s2$ of the step structure. In some embodiments, a lateral surface of the antenna 12 may be spaced apart from the surface $11s2$ of the step structure by a gap (not shown). Referring to FIG. 1A, the opening $12o$ penetrates from the top surface of the antenna 12 to the bottom surface of the antenna 12. The opening $12o$ may act as a passage for electromagnetic wave to transmit.

In some embodiments, a top surface and a bottom surface of the antenna pattern $12a$ are exposed. In some embodiments, a top surface and a bottom surface of the antenna pattern $12a$ are uncovered. In some embodiments, a top surface and a bottom surface of the antenna pattern $12a$ are exposed to air. In some embodiments, a top surface and a bottom surface of the antenna pattern $12a$ are in direct contact to air. In some embodiments, the semiconductor device package is disposed within a vacuum space or a vacuum cavity and thus a top surface and a bottom surface of the antenna pattern $12a$ is exposed to vacuum.

In some embodiments, the antenna 12 is, or includes, a conductive material such as a metal or metal alloy. Examples of the conductive material include Au, Ag, Al, Cu, or an alloy thereof.

Referring to FIG. 1A, the antenna 12 may be electrically connected to the metal layer 10m1 through a connection structure 12f and a connection element 16. In some embodiments, the connection structure 12f may function as a feeding element to provide signal to the antenna 12. In some embodiments, the connection structure 12f connecting the antenna 12 to the ground with the help of the metal layer 10m1. In some embodiments, the connection structure 12f may include, but not limited to, a metal pillar, a bonding wire or stacked vias. In some embodiments, the connection structure 12f includes Au, Ag, Al, Cu, or an alloy thereof. In some embodiments, the connection element 16 may include, but is not limited to, a solder ball or any other suitable electrical connection structures.

In some embodiments, the metal layer 10m1 electromagnetically couples with the antenna 12. In some embodiments, the metal layer 10m1 electrically connected to the antenna 12. In some embodiments, the metal layer 10m1 and the antenna 12 are referred to as an antenna structure.

Dielectric materials can be used in the manufacturing process of a semiconductor package device. Currently available dielectric materials may have a loss tangent or a dissipation factor (Df) that is greater than about 0.003 and a dielectric constant or a dissipation constant (Dk) that is greater than 3. Air or a vacuum can have a Df of approximately "0." Air or a vacuum can have a Dk of approximately "1." Dk and Df values of a dielectric layer may affect the performance of an antenna that is disposed adjacent to the dielectric layer.

Experiments may be conducted on two antennas, one antenna has a surface exposed to air (or a vacuum, with a Dk of approximately 1), and the other antenna has a surface covered by a dielectric material with a Dk of approximately 4. Experiment results show that the antenna having the surface exposed to air (or a vacuum, with a Dk of approximately 1) has a peak gain that is 2.3 times that of the other antenna having a surface covered by the dielectric material with a Dk of approximately 4.

Experiments may be conducted on two antennas, one antenna having a surface covered by a dielectric material with a Dk of approximately 2, and the other antenna having a surface covered by a dielectric material with a Dk of approximately 4. Experimental results show that under the condition that the thicknesses of the dielectric materials covering both antennas are the same, the antenna having a surface covered by the dielectric material with a Dk of approximately 2 has a peak gain that is 1.3 times that of the other antenna having a surface covered by the dielectric material with a Dk of approximately 4.

For example, as shown in FIG. 1A, parts of the antenna 12 can be exposed to air (or a vacuum), and in that case the performance of the antenna 12 can be about 1.3 to about 2.3 times that of antennas that have a surface covered by dielectric materials in accordance with some comparative embodiments of the subject application.

Figure 1B:
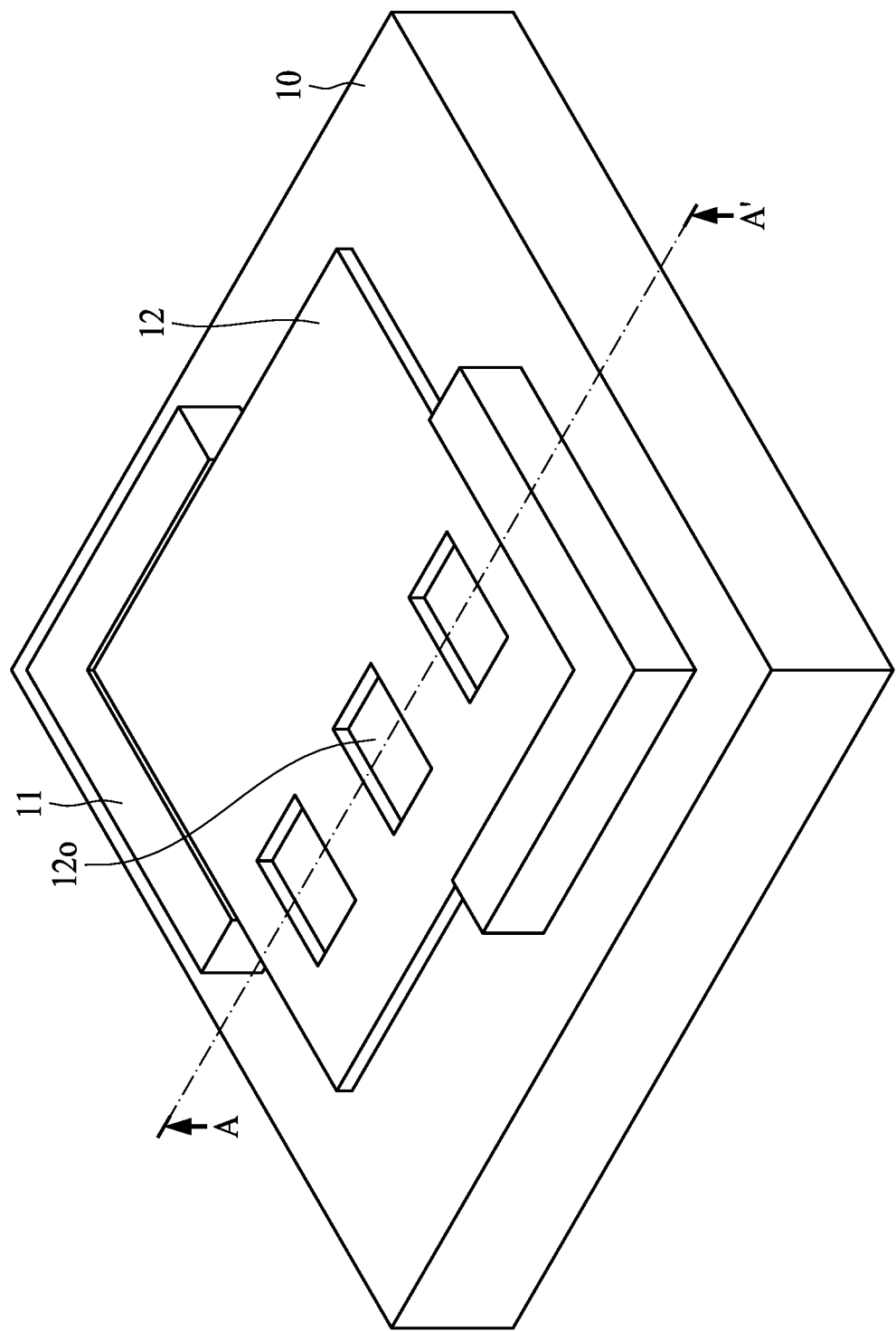
FIG. 1B illustrates a perspective view of a semiconductor device package in accordance with some embodiments of the present disclosure.

FIG. 1B illustrates a perspective view of a semiconductor device package in accordance with some embodiments of the present disclosure.

Referring to FIG. 1B, the support structure 11 is disposed to surround or partially surround the antenna 12 to support the antenna 12. FIG. 1A can be the cross-sectional view taken along the dotted line A-A' as shown in FIG. 1B. In the embodiment shown in FIG. 1B, the opening 12o includes a substantial rectangle shape. However, it can be contemplated that the opening 12o may include any other suitable shapes. In the embodiment shown in FIG. 1B, the antenna 12 includes one or more openings 12o. In some embodiments, it can be contemplated that the antenna 12 can be integrated formed without any openings.

Referring to FIG. 1B, the support structure 11 is disposed at two opposite corners of the antenna 12. The support structure 11 may be disposed at different corners or edges of the antenna 12 as long as the antenna 12 can be supported by the support structure 11. For example, the support structure 11 can be disposed at three corners of the antenna 12. For example, the support structure 11 can be disposed at four corners of the antenna 12. For example, the support structure 11 can fully surround the antenna 12.

Figure 2A:
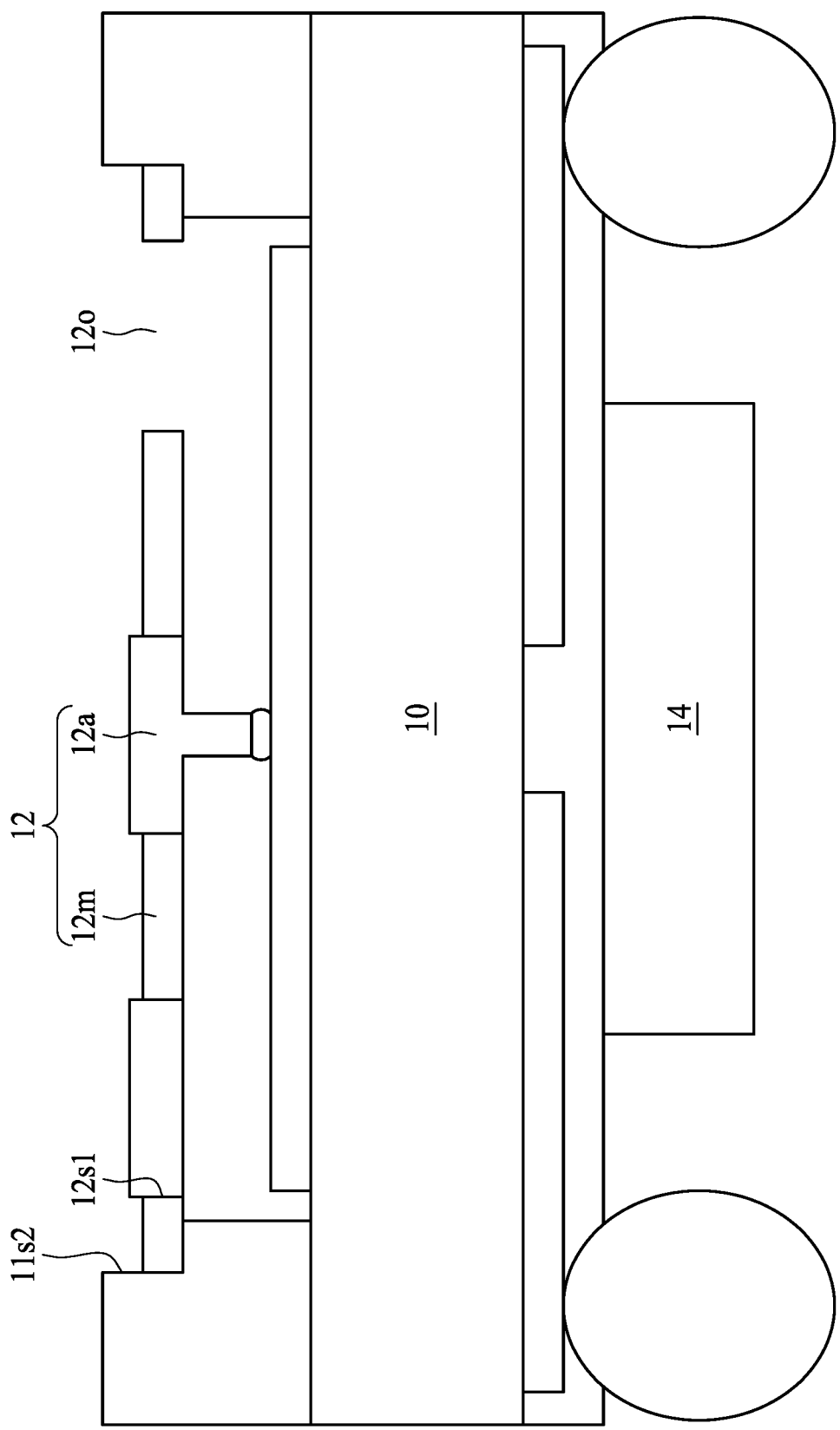
FIG. 2A illustrates a cross-sectional view of a semiconductor device package in accordance with some embodiments of the present disclosure.

FIG. 2A illustrates a cross-sectional view of a semiconductor device package in accordance with some embodiments of the present disclosure. The semiconductor device package shown in FIG. 2A is similar to that shown in FIG. 1A, except for that the antenna 12 further includes a protection layer 12m.

Referring to FIG. 2A, the antenna 12 includes an antenna pattern 12a and a protection layer 12m. The protection layer 12m can be in direct contact with the antenna pattern 12a. The protection layer 12m surrounds the antenna pattern 12a. For example, a lateral surface 12s1 of the antenna pattern 12a can be covered or in contact with the protection layer 12m. The antenna pattern 12a can be embedded within the protection layer 12m, wherein both surfaces of the antenna pattern 12a are uncovered by the protection layer 12m.

The antenna 12 includes an opening 12o penetrating from the top surface of the protection layer 12m to the bottom surface of the protection layer 12m. The opening 12o may act as a passage for electromagnetic wave to transmit.

The protection layer 12m may be an insulation layer to protect the antenna pattern 12a and to prevent the antenna pattern from being short. In some embodiments, the protection layer 12m may be formed of or includes a dielectric material. For example, the protection layer 12m may include molding compounds, pre-impregnated composite fibers (e.g., pre-preg), BPS), silicon oxide, silicon nitride, silicon oxynitride, USG, any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets.

In some embodiments, a top surface and a bottom surface of the antenna pattern 12a are exposed from the protection layer 12m. In some embodiments, a top surface and a bottom surface of the antenna pattern 12a are not covered by the protection layer 12m.

In some embodiments, the top surface and the bottom surface of the antenna pattern 12a are substantially coplanar with the top surface and the bottom surface of the protection layer 12m respectively. For example, a thickness of the antenna pattern 12a is substantially the same as a thickness of the protection layer 12m.

In some embodiments, the top surface of the antenna pattern 12a is recessed from the top surface of the protection layer 12m due to the manufacturing process of the antenna 12. In some embodiments, the bottom surface of the antenna pattern 12a is recessed from the bottom surface of the protection layer 12m due to the manufacturing process of the antenna 12. In some embodiments, the top surface of the antenna pattern 12a can protrude beyond the top surface of the protection layer 12m. In some embodiments, the bottom surface of the antenna pattern 12a can protrude beyond the bottom surface of the protection layer 12m.

In some embodiments, a metal finishing layer may be disposed on the top surface of the antenna pattern 12a (not shown). In some embodiments, the metal finishing layer disposed on the antenna pattern 12a is not coplanar with the top surface of the protection layer 12m. In some embodiments, the metal finishing layer disposed on the antenna pattern 12a protrudes beyond the top surface of the protection layer 12m. The metal finishing layer may include, but is not limited to Electroless Nickel Immersion Gold (ENIG) or any other suitable materials.

Referring to FIG. 2A, a lateral surface of the protection layer 12m is in contact with the surface 11s2 of the step structure. In some embodiments, a lateral surface of the protection layer 12m may be spaced apart from the surface 11s2 of the step structure by a gap (not shown).

Figure 2B:
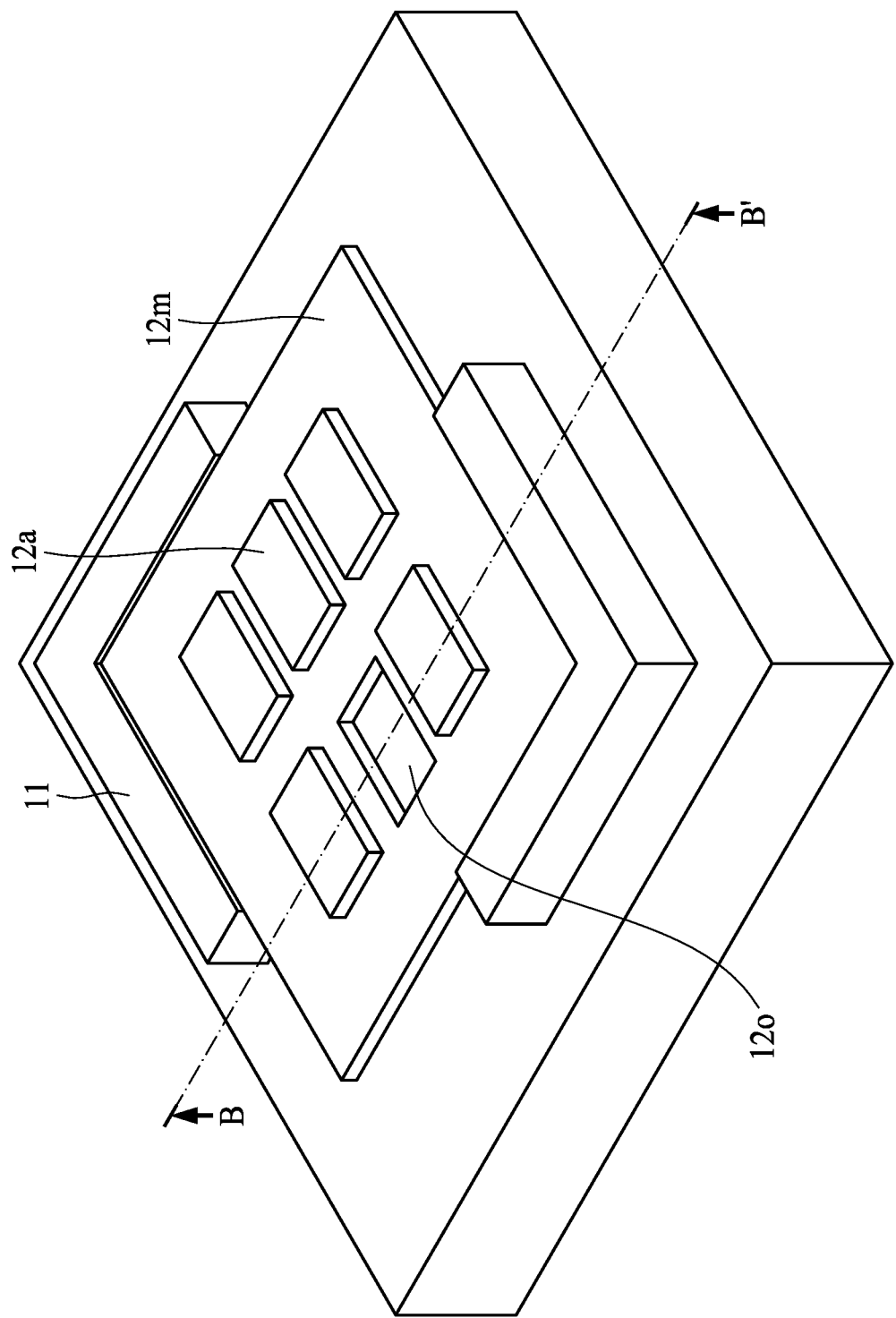
FIG. 2B illustrates a perspective view of a semiconductor device package in accordance with some embodiments of the present disclosure.

FIG. 2B illustrates a perspective view of a semiconductor device package in accordance with some embodiments of the present disclosure.

Referring to FIG. 2B, the support structure 11 is disposed to surround or partially surround the antenna 12 to support the antenna 12. FIG. 2A can be the cross-sectional view taken along the dotted line B-B' as shown in FIG. 2B.

Referring to FIG. 2B, the support structure 11 is disposed at two opposite corners of the antenna 12. The support structure 11 may be disposed at different corners or edges of the antenna 12 as long as the antenna 12 can be supported by the support structure 11. For example, the support structure 11 can be disposed at three corners of the antenna 12. For example, the support structure 11 can be disposed at four corners of the antenna 12. For example, the support structure 11 can fully surround the antenna 12.

Figure 3A:
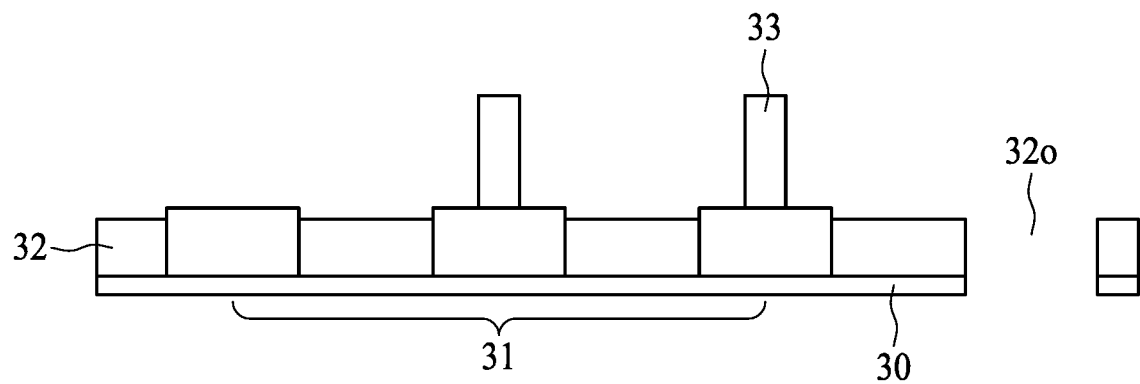
FIG. 3A illustrates a cross-sectional view of an antenna in accordance with some embodiments of the present disclosure.

FIG. 3A illustrates a cross-sectional view of an antenna in accordance with some embodiments of the present disclosure. Referring to FIG. 3A, the antenna includes a carrier 30, one or more of antenna patterns 31 and a protection layer 32. The antenna further includes one or more connection structures 33 disposed on the antenna patterns 31.

The protection layer 32 surrounds the antenna patterns 31. The protection layer 32 encapsulates the carrier 30. The protection layer 32 encapsulates the antenna patterns 31.

The antenna of FIG. 3A includes an opening 32o penetrating the carrier 30 and the protection layer 32. In some embodiments, a thickness of the antenna pattern 31 is substantially identical to a thickness of the protection layer. In some embodiments, a thickness of the antenna pattern 31 is different from a thickness of the protection layer. In some embodiments, a top surface of the antenna pattern 31 recessed from a top surface of the protection layer. In some embodiments, a top surface of the antenna pattern 31 protrudes beyond a top surface of the protection layer.

Figure 3B:
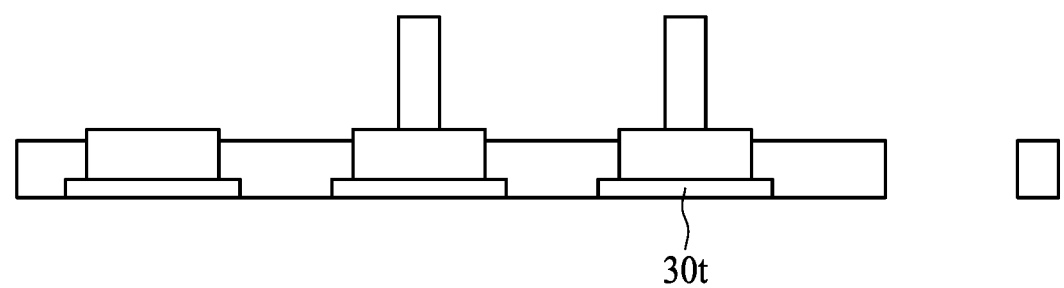
FIG. 3B illustrates a cross-sectional view of an antenna in accordance with some embodiments of the present disclosure.

FIG. 3B illustrates a cross-sectional view of an antenna in accordance with some embodiments of the present disclosure. Referring to FIG. 3B, the antenna includes one or more antenna patterns 31 and a protection layer 32. The antenna includes one or more connection structures 33 disposed on the antenna patterns 31. The antenna further includes a protruding structure 30t. The protruding structure 30t is disposed on a surface of the antenna pattern 31. The protruding structure 30t is in contact with a surface of the antenna pattern 31. The protruding structure 30t is mechanically attached to the antenna pattern 31. The protruding structure 30t is electrically connected to the antenna pattern 31.

The protruding structure 30t extends from the antenna pattern 31 into the protection layer 32. A gap exists between two adjacent protruding structures 30t. The bottom surface of the protruding structure 30t is substantially coplanar with the bottom surface of the protection layer 32. The protruding structure 30t may prevent the protection layer 32 from being stripped off the antenna patterns 31.

Figure 3C:
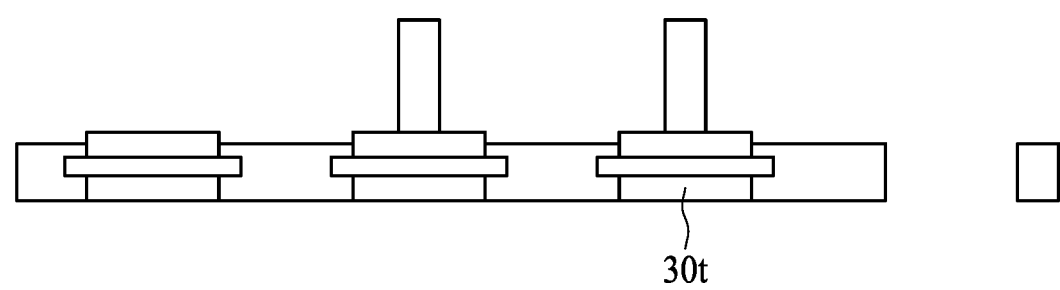
FIG. 3C illustrates a cross-sectional view of an antenna in accordance with some embodiments of the present disclosure.

FIG. 3C illustrates a cross-sectional view of an antenna in accordance with some embodiments of the present disclosure. Referring to FIG. 3C, the antenna includes one or more antenna patterns 31 and a protection layer 32. The antenna includes one or more connection structures 33 disposed on the antenna patterns 31. The antenna further includes a protruding structure 30t. The protruding structure 30t is disposed between the top surface and the bottom surface of antenna pattern 31. The protruding structure 30t is disposed along a direction parallel to the top surface of the antenna pattern 31.

The protruding structure 30t is mechanically attached to the antenna pattern 31. The protruding structure 30t is electrically connected to the antenna pattern 31. The protruding structure 30t extends from the antenna pattern 31 into the protection layer 32. The protruding structure 30t may prevent the protection layer 32 from being stripped off the antenna patterns 31.

Figure 4A:
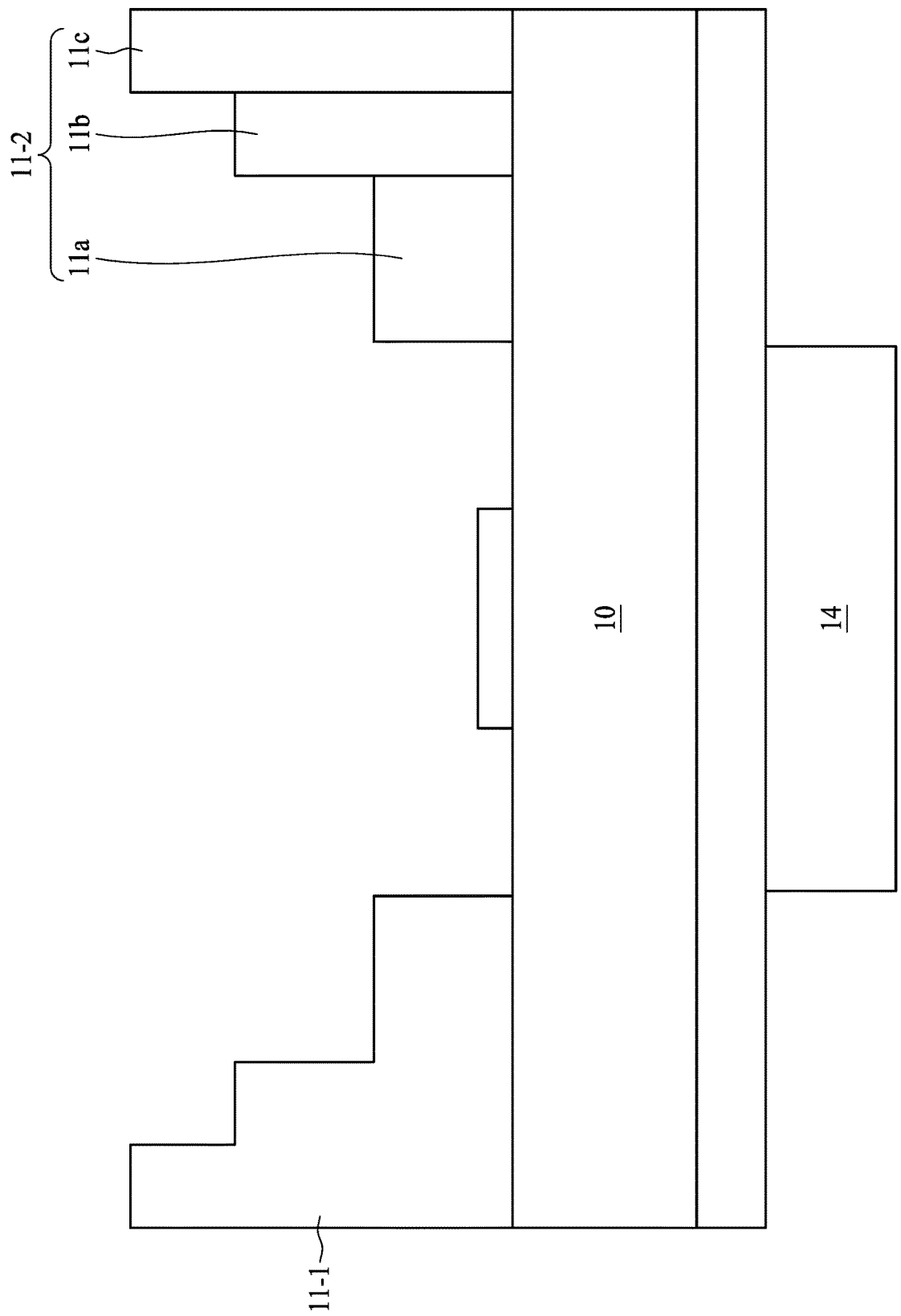
FIG. 4A illustrates a cross-sectional view of support structures in accordance with some embodiments of the present disclosure.

FIG. 4A illustrates a cross-sectional view of support structures in accordance with some embodiments of the present disclosure. Referring to FIG. 4A, the support structure 11-1 may be integrally-formed. In some embodiments, the support structure 11-1 may be formed by, for example, lithographic technique. In some embodiments, the support structure 11-1 may be formed by, for example, by three-dimensional printing technique.

Referring to FIG. 4A, the support structure 11-2 may be composed of several distinct components. For example, the support structure 11-2 may include support structures 11a, 11b and 11c. The support structures 11a, 11b and 11c are disposed on the substrate 10 and have different heights. The support structure 11a is disposed adjacent to the support structure 11b. The support structure 11b is disposed adjacent to the support structure 11c. The support structures 11a and 11b form a step structure. The support structures 11b and 11c form a step structure.

Figure 4B:
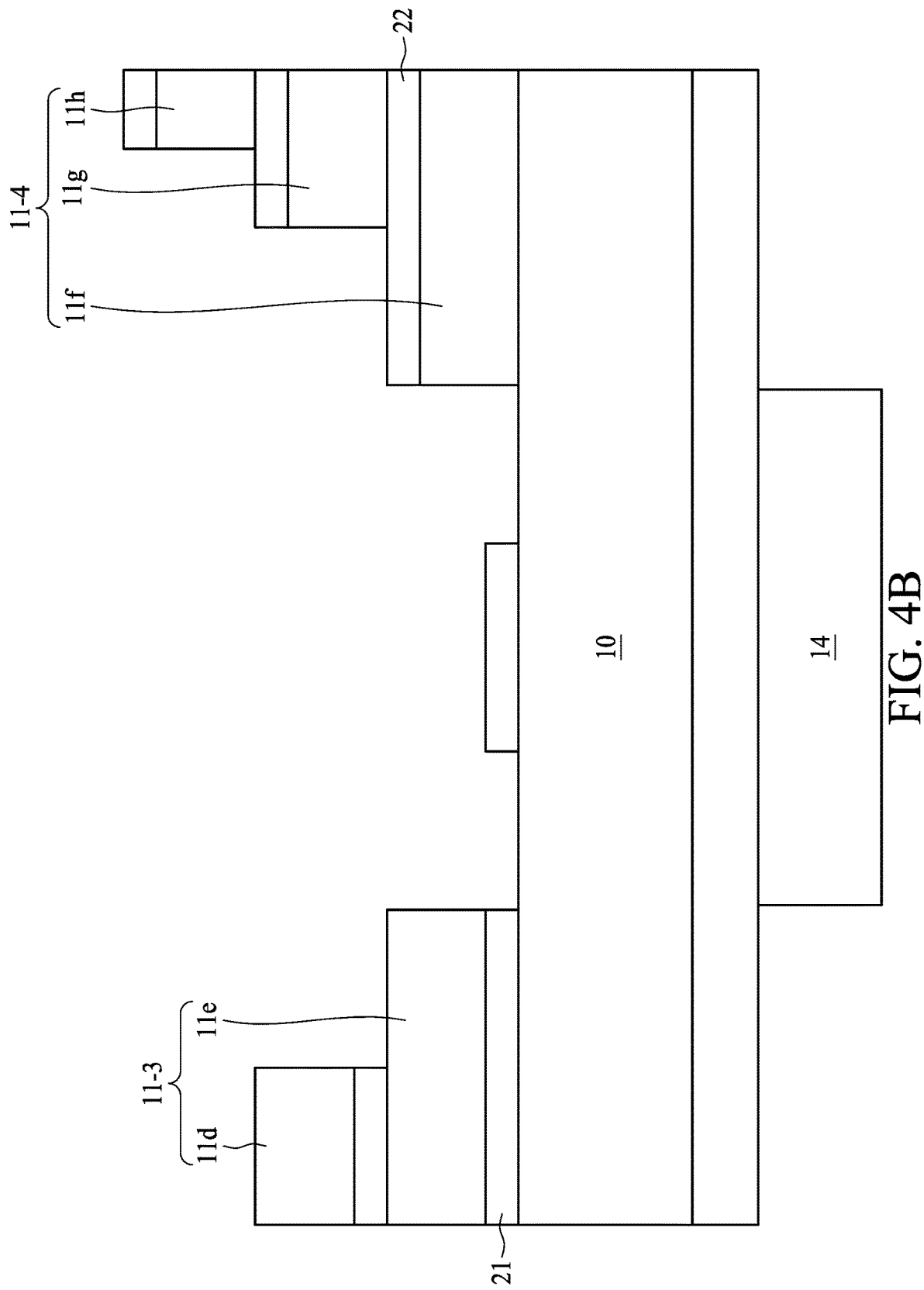
FIG. 4B illustrates a cross-sectional view of support structures in accordance with some embodiments of the present disclosure.

FIG. 4B illustrates a cross-sectional view of support structures in accordance with some embodiments of the present disclosure. Referring to FIG. 4B, the support structure 11-3 may be formed by stacking a support structure 11d on a support structure 11e. An adhesive layer 21 is disposed between the substrate 10 and the support structure 11e. An adhesive layer 21 is disposed between the support structure 11d and the support structure 11e. In some embodiments, the adhesive layer 21 may include a gel type or film type adhesive layer. The adhesive layer 21 may include a thermoset resin. The adhesive layer 21 may include a thermoplastic resin. The adhesive layer 21 may include one or more of the following: a resin, a polyester resin, a polyether resin, an epoxy resin and/or a polyolefin composition.

Referring to FIG. 4B, the support structure 11-4 may include multi-layers. In some embodiments, the support structure 11-4 includes a layer 11f, a layer 11g and a layer 11h. The layer 11f includes a protection layer 22 disposed on the top surface of the layer 11f. The layer 11g includes a protection layer 22 disposed on the top surface of the layer 11g. The layer 11h includes a protection layer 22 disposed on the top surface of the layer 11h.

The protection layer 22 is disposed on each of the layers 11f, 11g and 11h for the purpose of forming the step structure of the support structure 11-4. In some embodiments, the protection layer 22 may be removed from the layers 11f, 11g and 11*h* after the support structure 11-4 is formed. The process for forming the support structure 11-4 will be described in the subsequent paragraphs later.

Figure 5A:
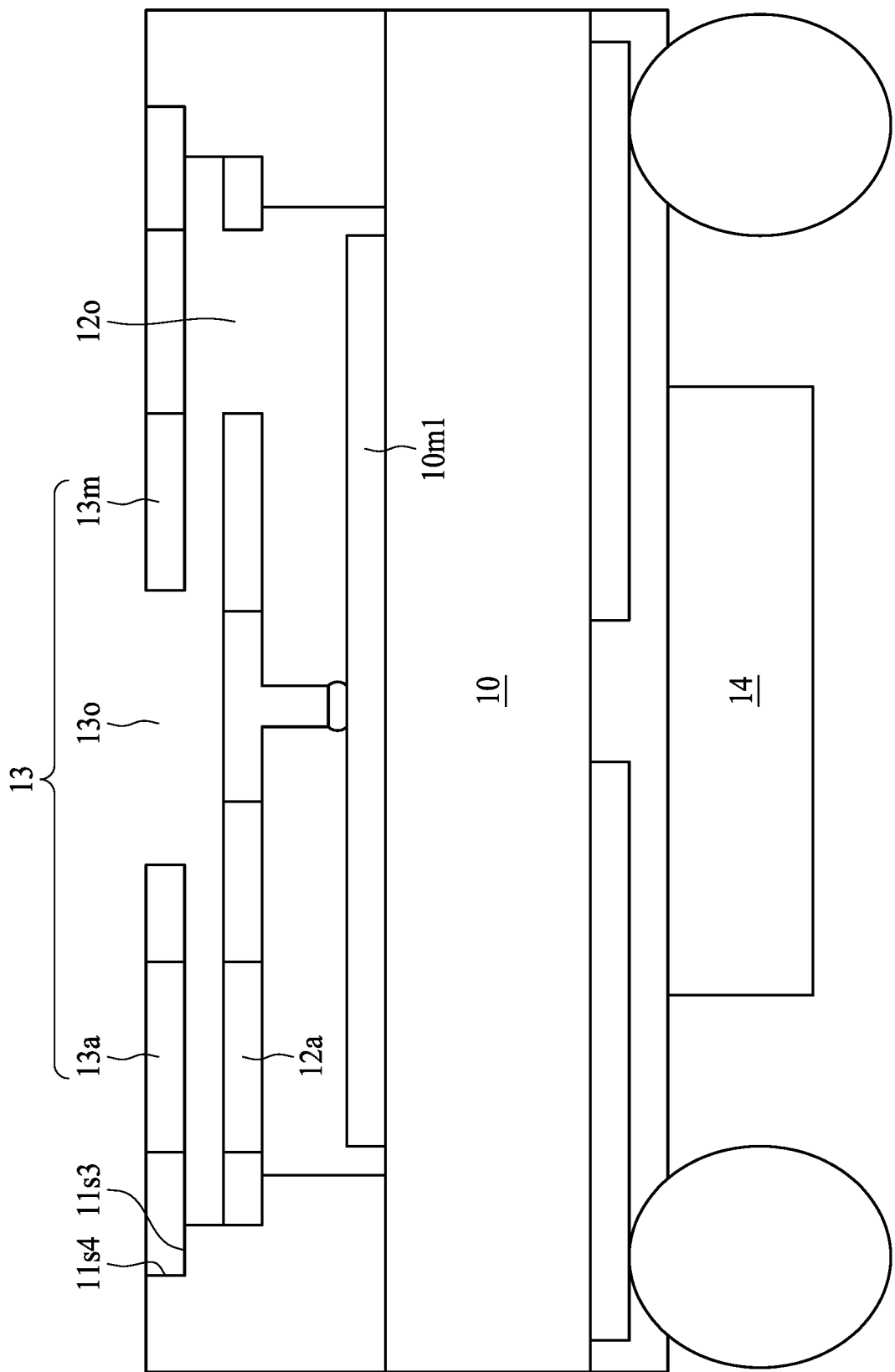
FIG. 5A illustrates a cross-sectional view of a semiconductor device package in accordance with some embodiments of the present disclosure.

FIG. 5A illustrates a cross-sectional view of a semiconductor device package in accordance with some embodiments of the present disclosure. The semiconductor device package shown in FIG. 5A is similar to the semiconductor device package shown in FIG. 2A, except for that the semiconductor device package shown in FIG. 5A further includes an antenna 13. Referring to FIG. 5A, the antenna 13 includes an antenna pattern 13*a*, a protection layer 13*m*, and an opening 13*o*. The antenna 13 is disposed on a surface 11*s*3 of the support structure 11. The support structure 11 includes a surface 11*s*4 connected to the surface 11*s*3. The surfaces 11*s*3 and 11*s*4 form a step structure (or a ladder structure).

In some embodiment, a lateral surface of the protection layer 13*m* is in contact with the surface 11*s*4 of the step structure. In some embodiments, a lateral surface of the protection layer 13*m* may be spaced apart from the surface 11*s*4 of the step structure by a gap (not shown).

Referring to FIG. 5A, the antenna 12 is disposed between the antenna 13 and the substrate 10. The antenna 12 includes an antenna pattern 12*a*. In some embodiments, the antenna pattern 12*a* is aligned with the antenna pattern 13*a* in the direction perpendicular to the top surface of the antenna 12. In some embodiments, the antenna pattern 12*a* electromagnetically couples with the antenna pattern 13*a*.

As shown in FIG. 5A, the signal can be coupled from the metal layer 10*m*1 to the antenna pattern 13*a* of the antenna 13 through the opening 12*o* of the antenna 12, and vice versa. The signal can be radiated from the antenna 12 upwardly through the opening 13*o* of the antenna 13. Since the signal can be transmitted between the metal layer 10*m*1 and the antennas 12 or 13 by coupling, no interconnection structure within the support structure 11 is included. In other embodiments, the support structure 11 may also include the interconnection structure as shown in FIG. 5B depending on different design specifications.

Figure 5B:
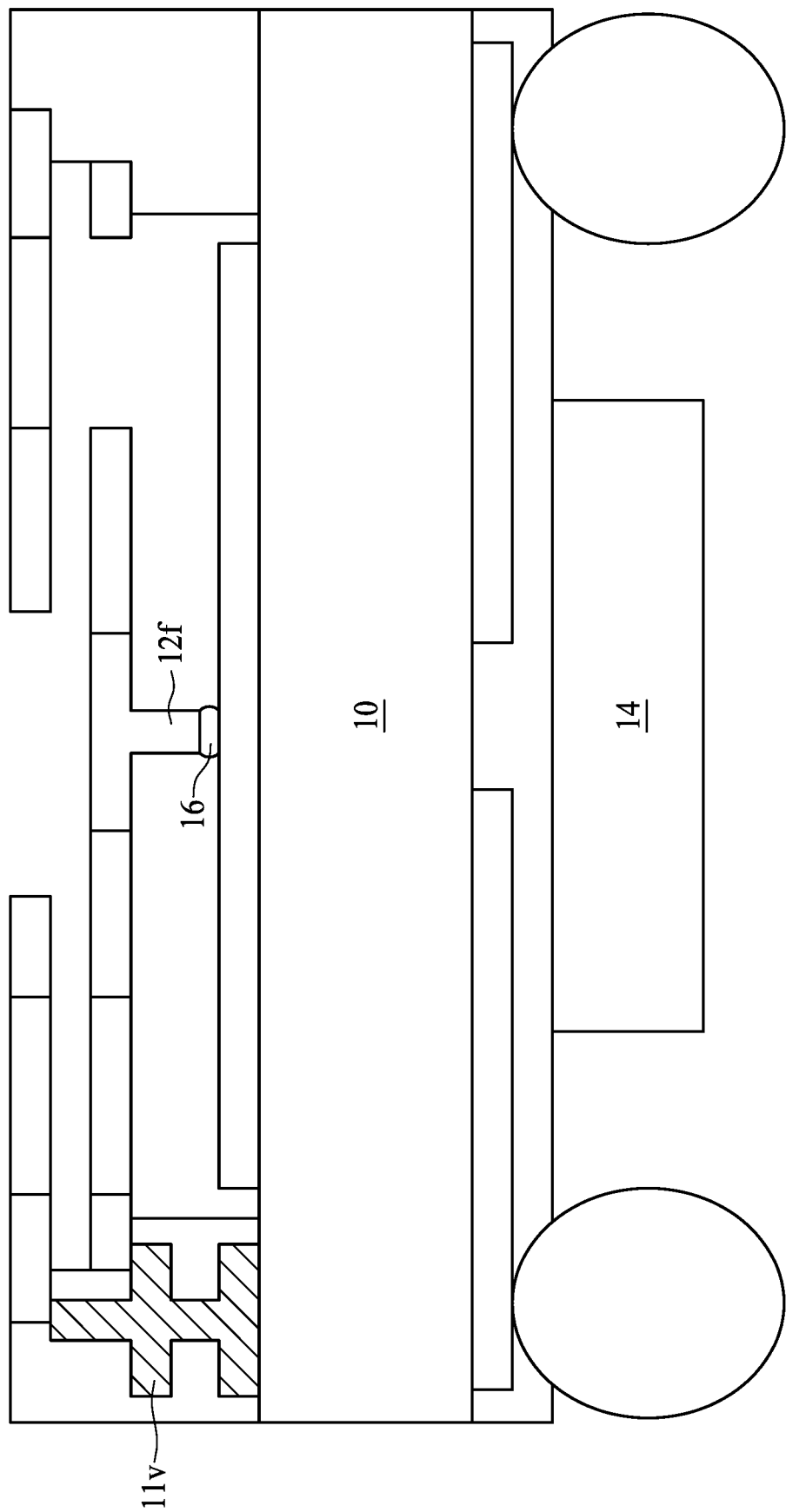
FIG. 5B illustrates a cross-sectional view of a semiconductor device package in accordance with some embodiments of the present disclosure.

FIG. 5B illustrates a cross-sectional view of a semiconductor device package in accordance with some embodiments of the present disclosure. The semiconductor device package in FIG. 5B is similar to the semiconductor device package in FIG. 5A except that the semiconductor device package in FIG. 5B further includes an interconnection structure 11*v*. The interconnection structure 11*v* is disposed within the support structure 11. The interconnection structure 11*v* is encapsulated or covered by the support structure 11. The interconnection structure 11*v* provides an electrical connection between the antenna package 13 and the substrate 10 and/or between the antenna package 12 and the substrate 10. In some embodiments, the interconnection structure 11*v* is a through via or a copper pillar. The signal can be transmitted from the metal plate 10*m*1 to the antenna package 13 through the interconnection structure 11*v*, and vice versa.

Figure 5C:
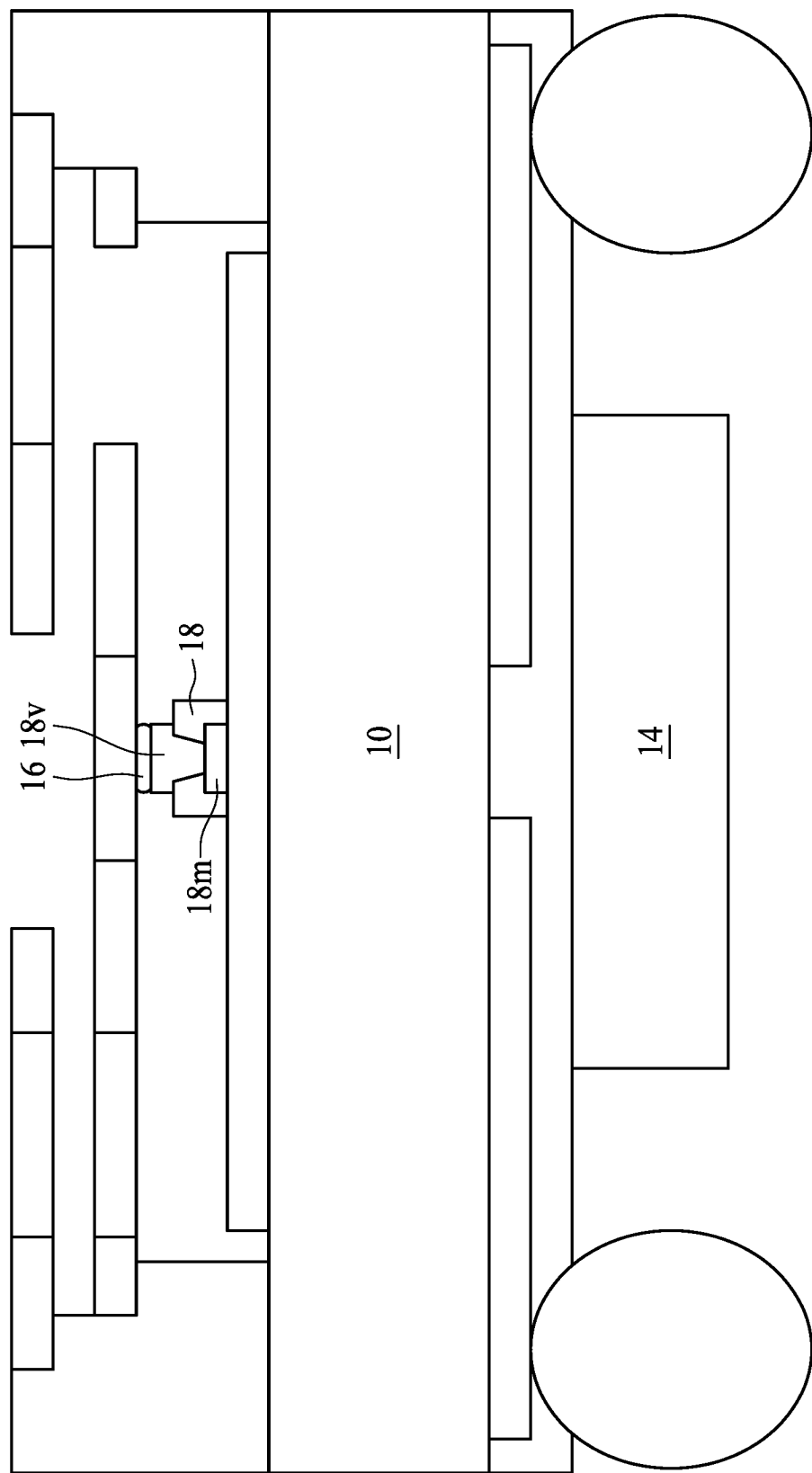
FIG. 5C illustrates a cross-sectional view of a semiconductor device package in accordance with some embodiments of the present disclosure.

FIG. 5C illustrates a cross-sectional view of a semiconductor device package in accordance with some embodiments of the present disclosure. The semiconductor device package in FIG. 5C is similar to the semiconductor device package in FIG. 5B except that the connection structure 12*f* shown in FIG. 5B is replaced by a support structure 18. Referring to FIG. 5C, the support structure 18 includes a metal layer 18*m* and an interconnection structure 18*v*. The support structure 18 surrounds the metal layer 18*m* and the interconnection structure 18*v*. The support structure 18 encapsulates the metal layer 18*m* and the interconnection structure 18*v*. The metal layer 18*m* and the interconnection structure 18*v* are embedded within the support structure 18.

The metal layer 18*m* may be referred to as a feeding element in the present disclosure. The antenna 12 is electrically connected to the metal layer 10*m*1 through the metal layer 18*m*, the interconnection structure 18*v* and the connection element 16. In some embodiments, the interconnection structure 18*v* is a through via or a copper pillar. Signal can be transmitted from the metal plate 10*m*1 to the antenna package 12 through the metal layer 18*m*, the interconnection structure 18*v* and the connection element 16, and vice versa.

Figure 5D:
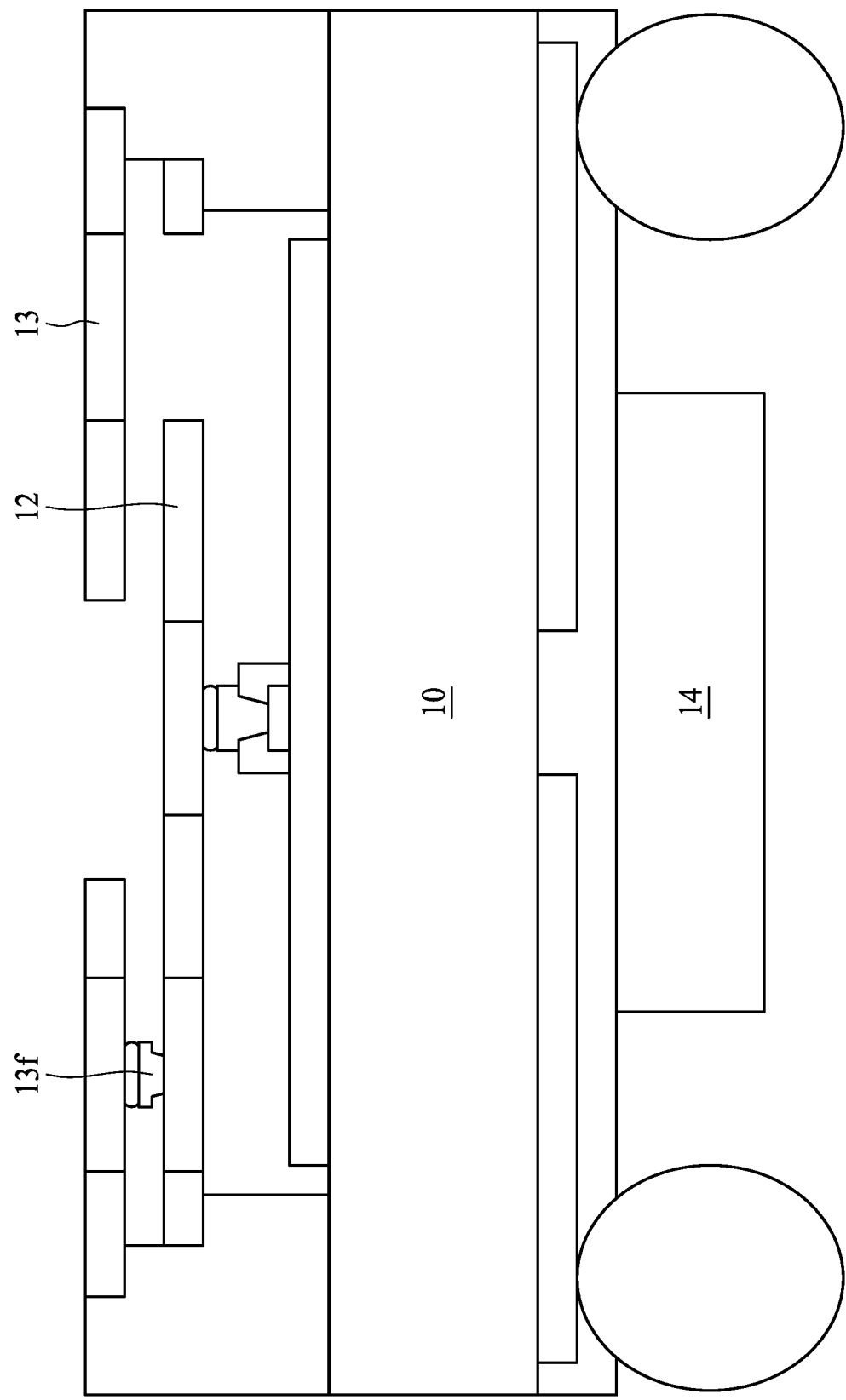
FIG. 5D illustrates a cross-sectional view of a semiconductor device package in accordance with some embodiments of the present disclosure.

FIG. 5D illustrates a cross-sectional view of a semiconductor device package in accordance with some embodiments of the present disclosure. The semiconductor device package in FIG. 5D is similar to the semiconductor device package in FIG. 5C except that the semiconductor device package in FIG. 5D further includes a connection structure 13*f*. The connection structure 13*f* is disposed between the antenna pattern 12*a* and the antenna pattern 13*a*. The connection structure 13*f* is electrically connected the antenna 12 to the antenna 13.

In some embodiments, the connection structure 13*f* is electrically connected the antenna 13 through a connection element 16. In some embodiments, the connection structure 13*f* may include, but not limited to, a metal pillar, a bonding wire or stacked vias. Signal can be transmitted from the antenna 12 to the antenna 13 through the connection structure 13*f* and the connection element 16, and vice versa.

Figure 5E:
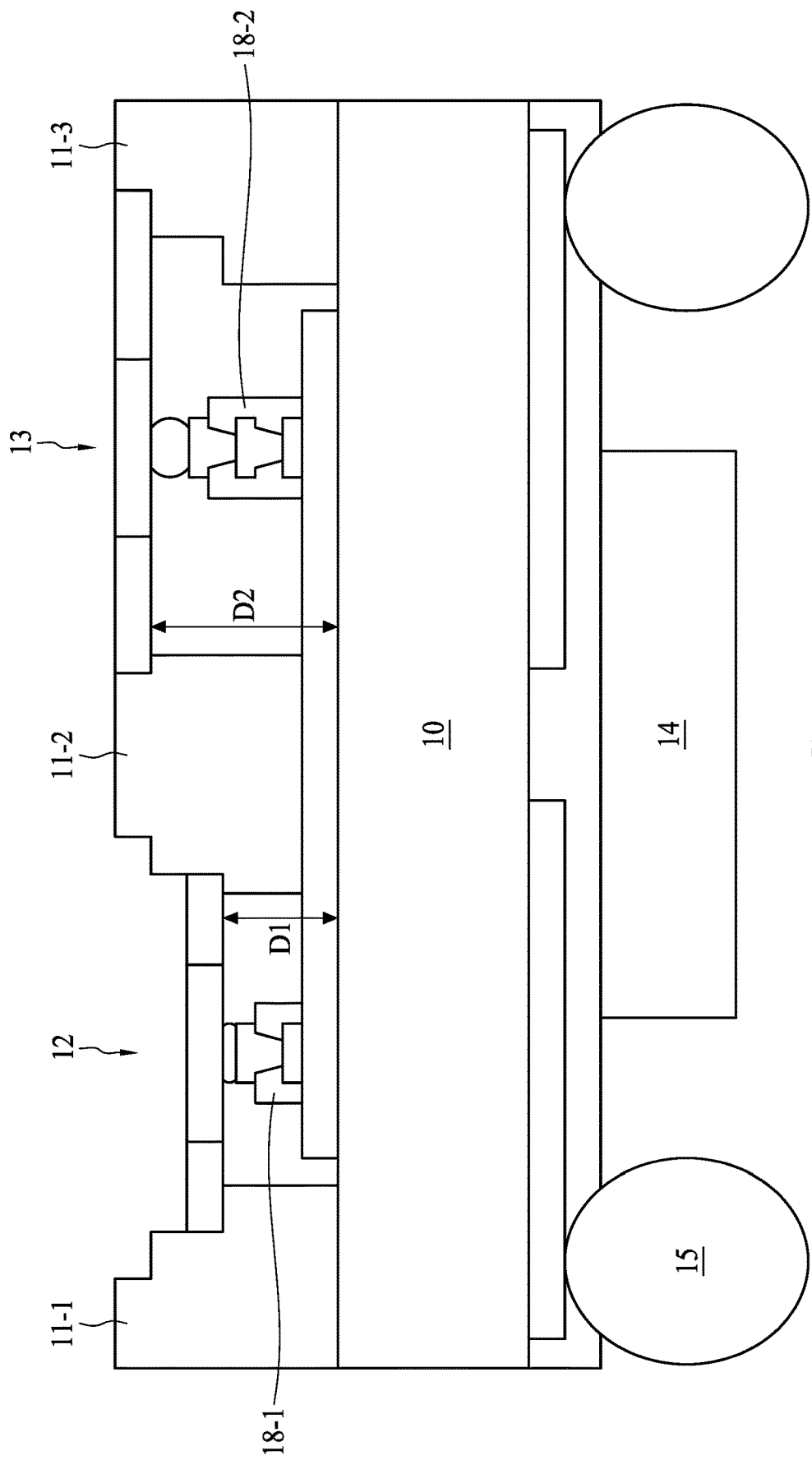
FIG. 5E illustrates a cross-sectional view of a semiconductor device package in accordance with some embodiments of the present disclosure.

FIG. 5E illustrates a cross-sectional view of a semiconductor device package in accordance with some embodiments of the present disclosure. The semiconductor device package of FIG. 5E includes a substrate 10 and support structures 11-1, 11-2 and 11-2 disposed above the substrate 10.

The semiconductor device package includes an antenna 12 disposed between the support structures 11-1 and 11-2. The semiconductor device package includes an antenna 13 disposed between the support structures 11-2 and 11-3. The antenna 12 is disposed on a step structure of the support structure 11-1. The antenna 12 is disposed on a step structure of the support structure 11-2. The antenna 13 is disposed on a step structure of the support structure 11-2. The antenna 13 is disposed on a step structure of the support structure 11-3.

The semiconductor device package further includes an electronic component 14 and electrical contacts 15.

The antenna 12 is spaced apart from the top surface of the substrate 10 by a distance D1. The antenna 13 is spaced apart from the top surface of the substrate 10 by a distance D2. Referring to FIG. 5E, D2 is greater than D1.

The antenna 12 is electrically connected to the metal layer 10*m*1 through the support structure 18-1. The antenna 13 is electrically connected to the metal layer 10*m*1 through the support structure 18-2. The support structure 18-1 has a structure similar to or identical to the support structure 18 shown in FIG. 5C. The support structure 18-2 has a structure similar to the support structure 18 shown in FIG. 5C.

Figure 5F:
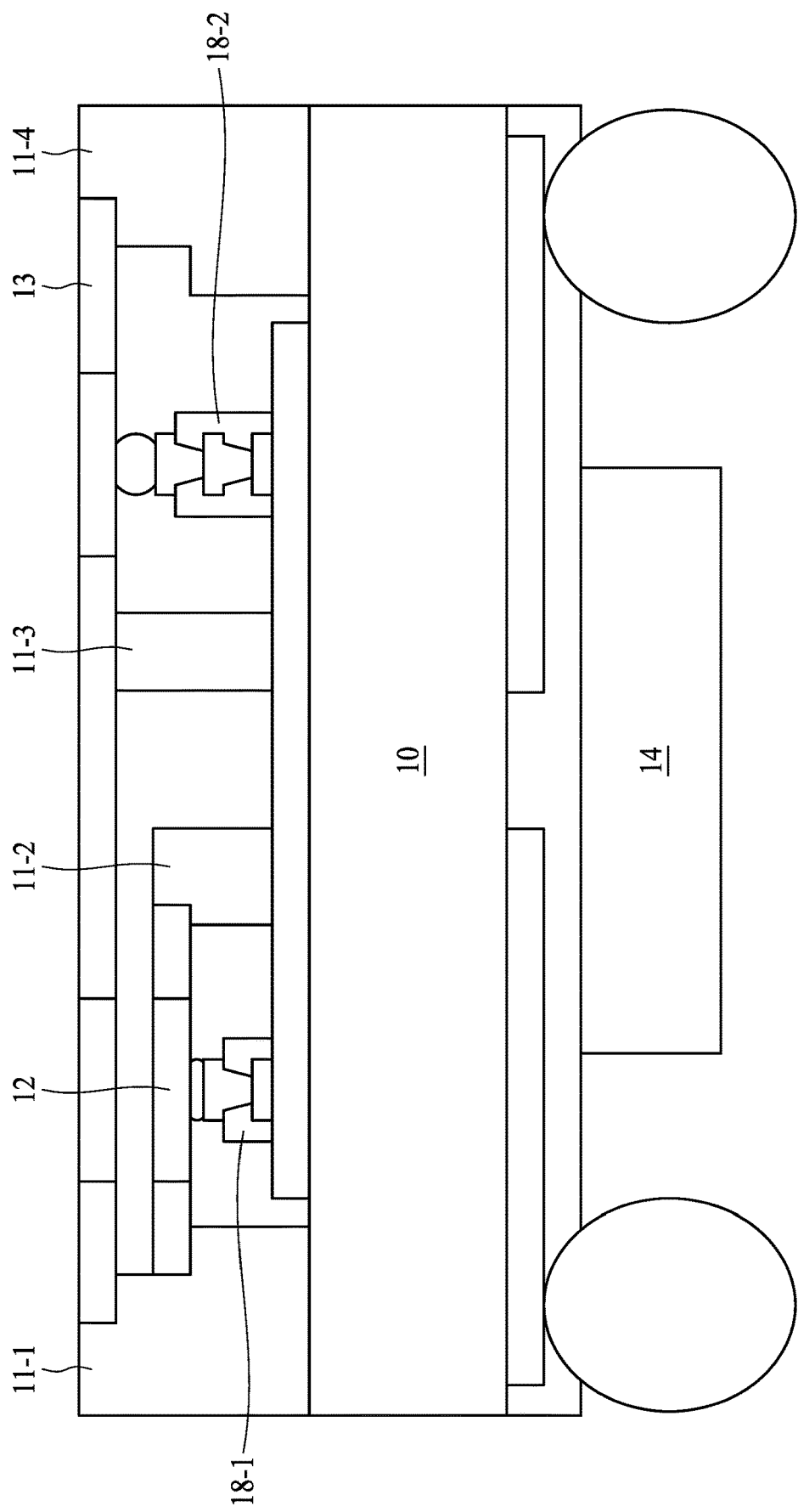
FIG. 5F illustrates a cross-sectional view of a semiconductor device package in accordance with some embodiments of the present disclosure.

FIG. 5F illustrates a cross-sectional view of a semiconductor device package in accordance with some embodiments of the present disclosure. The semiconductor device package of FIG. 5F includes a substrate 10 and support structures 11-1, 11-2, 11-3 and 11-4 disposed above the substrate 10.

Referring to FIG. 5F, the semiconductor device package includes an antenna 12 disposed between the support structures 11-1 and 11-2. The semiconductor device package includes an antenna 13 disposed on the support structures 11-1, 11-3 and 11-4. The antenna 12 is disposed on a step structure of the support structure 11-1. The antenna 12 is disposed on a step structure of the support structure 11-2. The antenna 13 is disposed on a step structure of the support structure 11-1. The antenna 13 is disposed on the top surface of the support structure 11-3. The antenna 13 is disposed on a step structure of the support structure 11-4. The top surface of the support structure 11-3 is in contact with the protection layer 13m of the antenna 13.

In some embodiments, the support structures 11-1, 11-2, 11-3 and 11-4 are formed of or include the same material. In some embodiments, the support structures 11-1, 11-2, 11-3 and 11-4 are formed of or include different materials.

The antenna 12 is electrically connected to the metal layer 10m1 through the support structure 18-1. The antenna 13 is electrically connected to the metal layer 10m1 through the support structure 18-2. The support structure 18-1 has a structure similar to or identical to the support structure 18 shown in FIG. 5C. The support structure 18-2 has a structure similar to the support structure 18 shown in FIG. 5C.

Figure 5G:
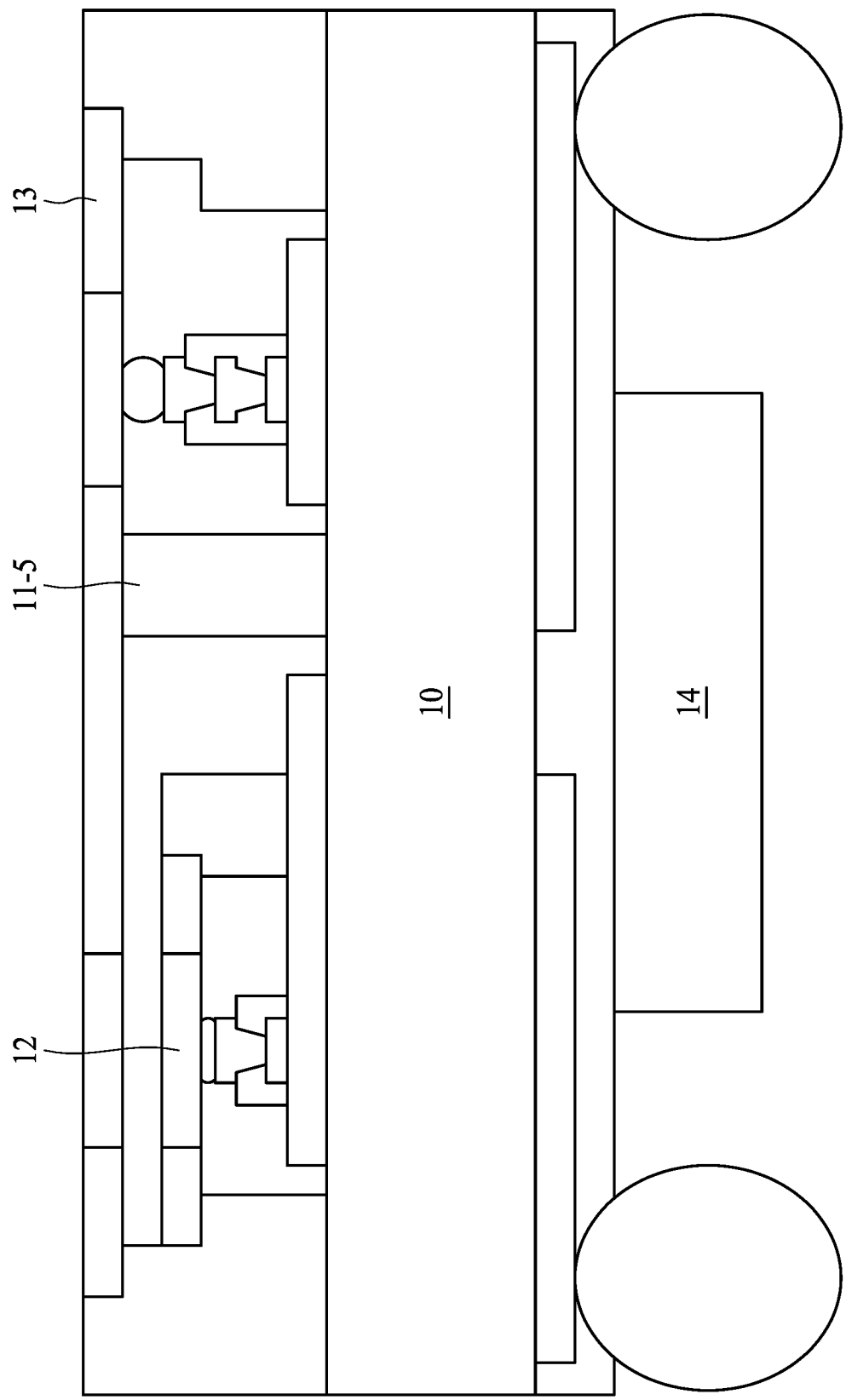
FIG. 5G illustrates a cross-sectional view of a semiconductor device package in accordance with some embodiments of the present disclosure.

FIG. 5G illustrates a cross-sectional view of a semiconductor device package in accordance with some embodiments of the present disclosure. The semiconductor device package in FIG. 5G is similar to the semiconductor device package in FIG. 5F except that the support structure 11-3 of FIG. 5F is replaced by a shielding structure 11-5.

In some embodiments, the shielding structure 11-5 is a conductive component, and may include, for example, aluminum (Al), copper (Cu), chromium (Cr), tin (Sn), gold (Au), silver (Ag), nickel (Ni) or stainless steel, or a mixture, an alloy, or other combination thereof. The shielding structure 11-5 can prevent the electromagnetic signal emitted by the antenna 12 from adversely affecting the antenna 13, and vice versa.

Figure 5H:
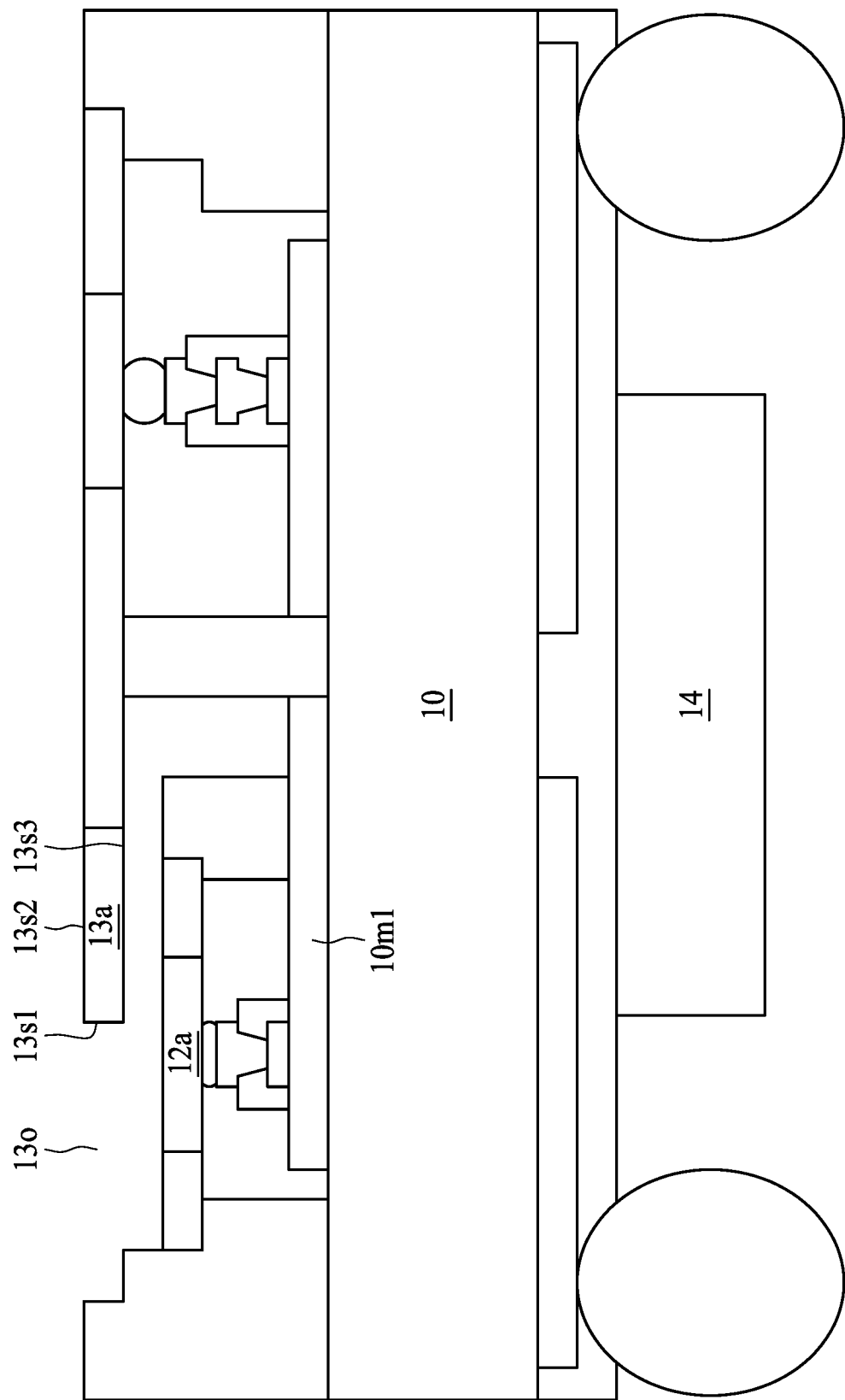
FIG. 5H illustrates a cross-sectional view of a semiconductor device package in accordance with some embodiments of the present disclosure.

FIG. 5H illustrates a cross-sectional view of a semiconductor device package in accordance with some embodiments of the present disclosure. The semiconductor device package in FIG. 5H is similar to the semiconductor device package in FIG. 5F except that the antenna 13 includes an opening 13o penetrating from the top surface of the antenna 13 to the bottom surface of the antenna 13. Referring to FIG. 5H, the antenna pattern 13a of the antenna 13 includes surfaces 13s1, 13s2 and 13s3. In some embodiments, the surfaces 13s1, 13s2 and 13s3 are not covered by the protection layer 13m. In some embodiments, the surfaces 13s1, 13s2 and 13s3 are exposed to air. In some embodiments, the surfaces 13s1, 13s2 and 13s3 are exposed to a vacuum.

In the embodiment shown in FIG. 5H, the antenna pattern 13a is not aligned with the antenna pattern 12a. In some embodiments, it can be contemplated that the antenna pattern 13a can be aligned with the antenna pattern 12a in a direction parallel to the surface 13s1. In some embodiments, the antenna pattern 13a can be aligned with the antenna pattern 12a in a direction perpendicular to the surface 13s2. In the condition that the antenna pattern 13a is not aligned with the antenna pattern 12a, signals can be transmitted between the antenna 13 and the metal layer 10m1 through coupling. In the condition that the antenna pattern 13a is aligned with the antenna pattern 12a, signals can be transmitted between the antenna 13 and the antenna pattern 12a through coupling.

Figure 5I:
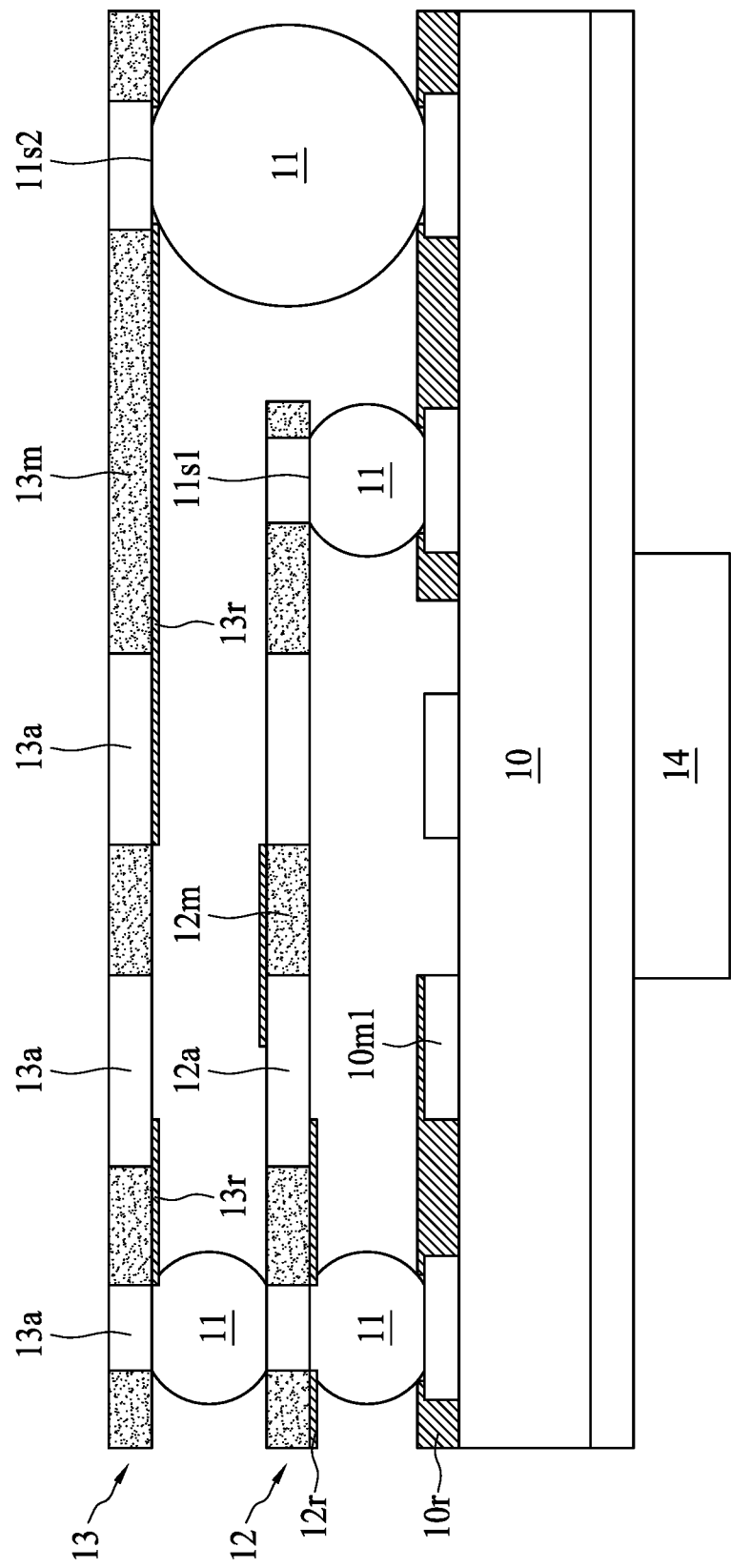
FIG. 5I illustrates a cross-sectional view of a semiconductor device package in accordance with some embodiments of the present disclosure.

FIG. 5I illustrates a cross-sectional view of a semiconductor device package in accordance with some embodiments of the present disclosure.

Referring to FIG. 5I, the semiconductor device package includes a substrate 10, one or more support structures 11, an antenna 12, an antenna 13 and an electronic component 14. A metal layer 10m1 can be disposed on the substrate 10. The metal layer 10m1 can include several patterns. Some of the patterns of the metal layer 10m1 may act as a conductive pad. Some of the patterns of the metal layer 10m1 may act as a feeding element for transmitting/receiving signals to/from the antenna 12. Some of the patterns of the metal layer 10m1 may act as a feeding element for transmitting/receiving signals to/from the antenna 13.

The semiconductor device package may include a solder resist layer 10r disposed on the top surface of the substrate 10. The solder resist layer 10r may cover a sidewall of the metal layer 10m1. The solder resist layer 10r may cover at least a portion of the top surface of the metal layer 10m1. The solder resist layer 10r may cover the entire top surface of the metal layer 10m1. The solder resist layer 10r may expose a portion of the top surface of the metal layer 10m1. The solder resist layer 10r may form an opening on the top surface of the metal layer 10m1.

The antenna 12 includes one or more antenna patterns 12a. The antenna 12 includes a protection layer 12m surrounds the one or more antenna patterns 12a. The antenna 12 includes a protection layer 12m covers the one or more antenna patterns 12a. The antenna 13 includes one or more antenna patterns 13a. The antenna 13 includes a protection layer 13m surrounds the one or more antenna patterns 13a. The antenna 13 includes a protection layer 13m covers the one or more antenna patterns 13a.

The antenna 12 may include a solder resist layer 12r disposed on a surface of the protection layer 12m. In some embodiments, the solder resist layer 12r may have a thickness of about 15 micrometers. In some embodiments, the solder resist layer 12r may include an edge that is aligned with an edge of the protection layer 12m. In some embodiments, the solder resist layer 12r may include two edges that are aligned with two edges of the protection layer 12m. In some embodiments, the solder resist layer 12r may include an edge that is not aligned with an edge of the protection layer 12m.

The solder resist layer 12r may expose a portion of a surface of the antenna pattern 12a. The solder resist layer 12r may expose a surface of the antenna pattern 12a. The solder resist layer 12r may form an opening on a surface of the antenna pattern 12a.

In some embodiments, the solder resist layer 12r may extend beyond an edge of the protection layer 12m and cover at least a portion of the antenna pattern 12a. In some embodiments, both surfaces of the antenna pattern 12a may include a protection layer 12m. The solder resist layer 12r, when disposed on a portion of a surface of the antenna pattern 12a, may prevent oxidation (for example, getting rusty or corrosion) on the portion of the antenna pattern 12a.

The antenna 13 may include a solder resist layer 13r disposed on a surface of the protection layer 13m. In some embodiments, the solder resist layer 13r may have a thickness of about 15 micrometers. In some embodiments, the solder resist layer 13r may include an edge that is aligned with an edge of the protection layer 13m. In some embodiments, the solder resist layer 13r may include two edges that are aligned with two edges of the protection layer 13m. In some embodiments, the solder resist layer 13r may include an edge that is not aligned with an edge of the protection layer 13m.

In some embodiments, the solder resist layer 13r may extend beyond an edge of the protection layer 13m and cover at least a portion of the antenna pattern 13a. In some embodiments, the solder resist layer 13r may extend beyond an edge of the protection layer 13m and completely cover a surface of the antenna pattern 13a. In some embodiments, both surfaces of the antenna pattern 13a may include a protection layer 13m. The solder resist layer 13r, when disposed on a portion of a surface of the antenna pattern 13a, may prevent oxidation (for example, getting rusty or corrosion) on the portion of the antenna pattern 13a.

The solder resist layer 13r may expose a portion of a surface of the antenna pattern 13a. The solder resist layer 13r may expose a surface of the antenna pattern 13a. The solder resist layer 13r may form an opening on a surface of the antenna pattern 13a.

Referring to FIG. 5I, the antenna 12 can be supported by two support structures 11. The antenna 12 can be disposed on the surface 11s1 of the support structure 11. The antenna 12 can be spaced apart from the substrate 10 by the support structures 11. In some embodiments, the support structure 11 may include, but is not limited to, a solder ball or any other suitable electrical connection structures. In some embodiments, the antenna 12 can be electrically connected to the metal layer 10m1 through the support structure 11. In some embodiments, the support structure 11 can be in direct contact with one or more of the antenna patterns 12a. In some embodiments, the support structure 11 can be in direct contact with the metal layer 10m1. In some embodiments, the antenna 12 can be mechanically attached to the metal layer 10m1 through the support structure 11.

In some embodiments, the support structure 11 can be disposed within the opening defined by the solder resist layer 10r. In some embodiments, the support structure 11 can be disposed within the opening defined by the solder resist layer 12r. In some embodiments, the support structure 11 can be disposed within the opening defined by the solder resist layer 13r. The support structure 11 can be limited by the opening defined by the solder resist layer 10r. The support structure 11 can be limited by the opening defined by the solder resist layer 12r. The support structure 11 can be limited by the opening defined by the solder resist layer 13r.

The opening defined by the solder resist layer 10r can provide a better positioning to the support structure 11. The opening defined by the solder resist layer 12r can provide a better positioning to the support structure 11. The opening defined by the solder resist layer 13r can provide a better positioning to the support structure 11. The opening defined by the solder resist layer 10r can prevent undesired leakages of the support structure 11 during the reflow procedure. The opening defined by the solder resist layer 12r can prevent undesired leakages of the support structure 11 during the reflow procedure. The opening defined by the solder resist layer 13r can prevent undesired leakages of the support structure 11 during the reflow procedure.

The antenna 13 can be supported by one or more support structures 11. The antenna 13 can be disposed on the surface 11s2 of the support structure 11. In some embodiments, the antenna 13 can be supported by one support structure 11 disposed between the substrate 10 and the antenna 13. In some embodiments, the antenna 13 can be supported by one support structure 11 disposed between the antenna 12 and the antenna 13.

In some embodiments, the antenna 13 can be electrically connected to the metal layer 10m1 through the support structure 11. In some embodiments, the support structure 11 can be in direct contact with one or more of the antenna patterns 13a and the metal layer 10m1. In some embodiments, the antenna 13 can be mechanically attached to the metal layer 10m1 through the support structure 11.

In some embodiments, the antenna 13 can be electrically connected to the antenna 12 through the support structure 11. In some embodiments, the support structure 11 can be in direct contact with one or more of the antenna patterns 12a and one or more of the antenna patterns 13a. In some embodiments, the antenna 13 can be mechanically attached to the antenna 12 through the support structure 11.

The antenna pattern 12a can be aligned with the antenna pattern 13a through one or more support structures 11. The antenna pattern 12a and the antenna pattern 13a can be aligned in a direction perpendicular to the top surface of the substrate 10 through one or more support structures 11.

Figure 6A:
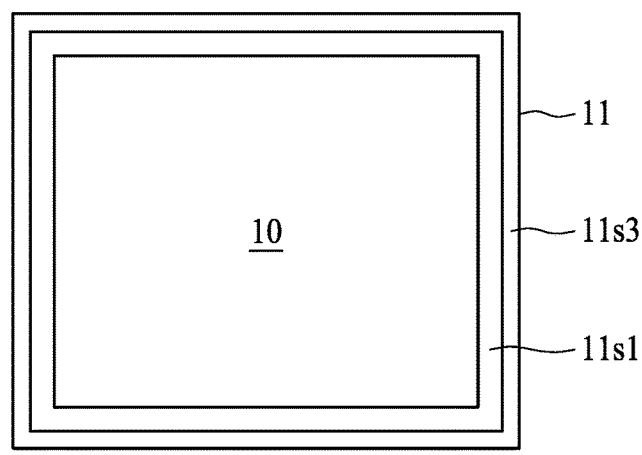
FIG. 6A illustrates a top view of a semiconductor device package in accordance with some embodiments of the present disclosure.

FIG. 6A illustrates a top view of a semiconductor device package in accordance with some embodiments of the present disclosure. For simplicity, the substrate 10 and the support structure 11 are depicted while the other components are omitted. Referring to FIG. 6A, the support structure 11 fully surrounds the edges of the substrate 10. Referring to FIG. 6A, the surface 11s3 and the surface 11s1 is not coplanar. The antenna 11 as illustrated in accordance with FIGS. 1A and 2A may be disposed on the surface 11s1 of the support structure 11.

Figure 6B:
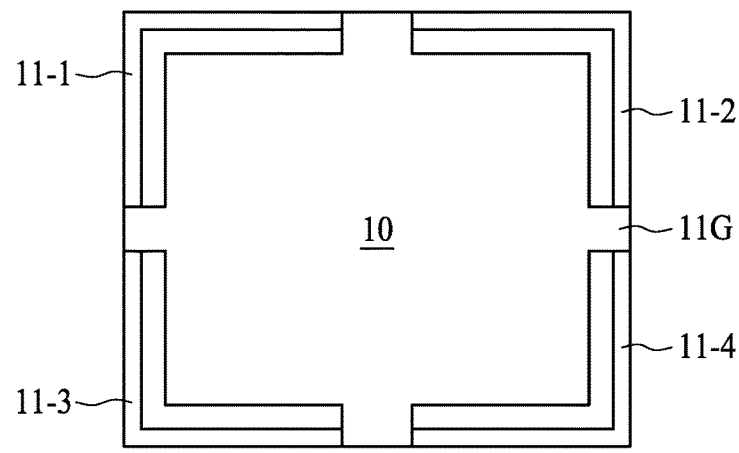
FIG. 6B illustrates a top view of a semiconductor device package in accordance with some embodiments of the present disclosure.

FIG. 6B illustrates a top view of a semiconductor device package in accordance with some embodiments of the present disclosure. For simplicity, the substrate 10 and the support structure 11 are depicted while the other components are omitted. Referring to FIG. 6B, support structures 11-1, 11-2, 11-3 and 11-4 are disposed around the four corners of the substrate 10. In some embodiments, the support structure 11-1 and the support structure 11-2 are separated by a gap 11G. In some embodiments, the support structure 11-1 and the support structure 11-3 are separated by a gap 11G. In some embodiments, the support structure 11-2 and the support structure 11-4 are separated by a gap 11G. In some embodiments, the support structure 11-3 and the support structure 11-4 are separated by a gap 11G.

Figure 6C:
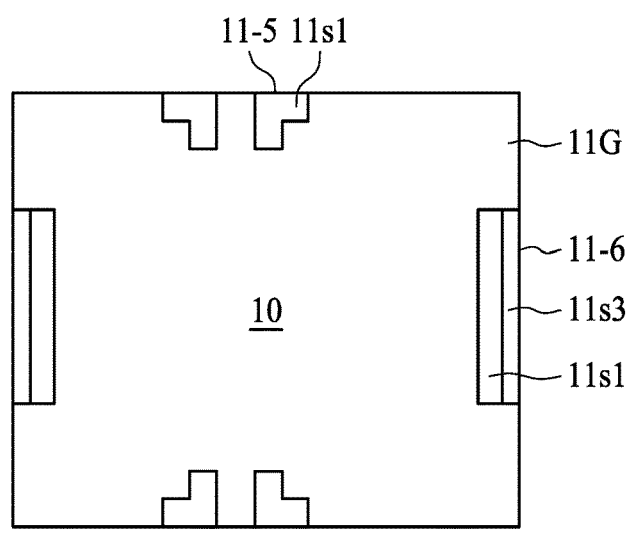
FIG. 6C illustrates a top view of a semiconductor device package in accordance with some embodiments of the present disclosure.

FIG. 6C illustrates a top view of a semiconductor device package in accordance with some embodiments of the present disclosure. For simplicity, the substrate 10 and the support structure 11 are depicted while the other components are omitted. The semiconductor device package of FIG. 6C includes a support structure 11-5 and a support structure 11-6. The support structure 11-5 includes a top surface 11s1. The support structure 11-6 includes a surface 11s1 and a surface 11s3. The surface 11s1 of the support structure 11-5 is in the same level as the surface 11s1 of the support structure 11-6. The surface 11s3 of the support structure 11-6 is in a level higher than the surface 11s1 of the support structure 11-6. The surface 11s3 of the support structure 11-6 is spaced apart from the top surface of the substrate 10 by a first distance and the surface 11s1 of the support structure 11-6 is spaced apart from the top surface of the substrate 10 by a second distance. The first distance is greater than the second distance.

In some embodiments, the antenna 12 is disposed on the surface 11s1 of the support structure 11-5. In some embodiments, the antenna 12 is disposed on the surface 11s1 of the support structure 11-6. In some embodiments, the antenna 12 is disposed on the surface 11s1 of the support structures 11-5 and 11-6.

Figure 6D:
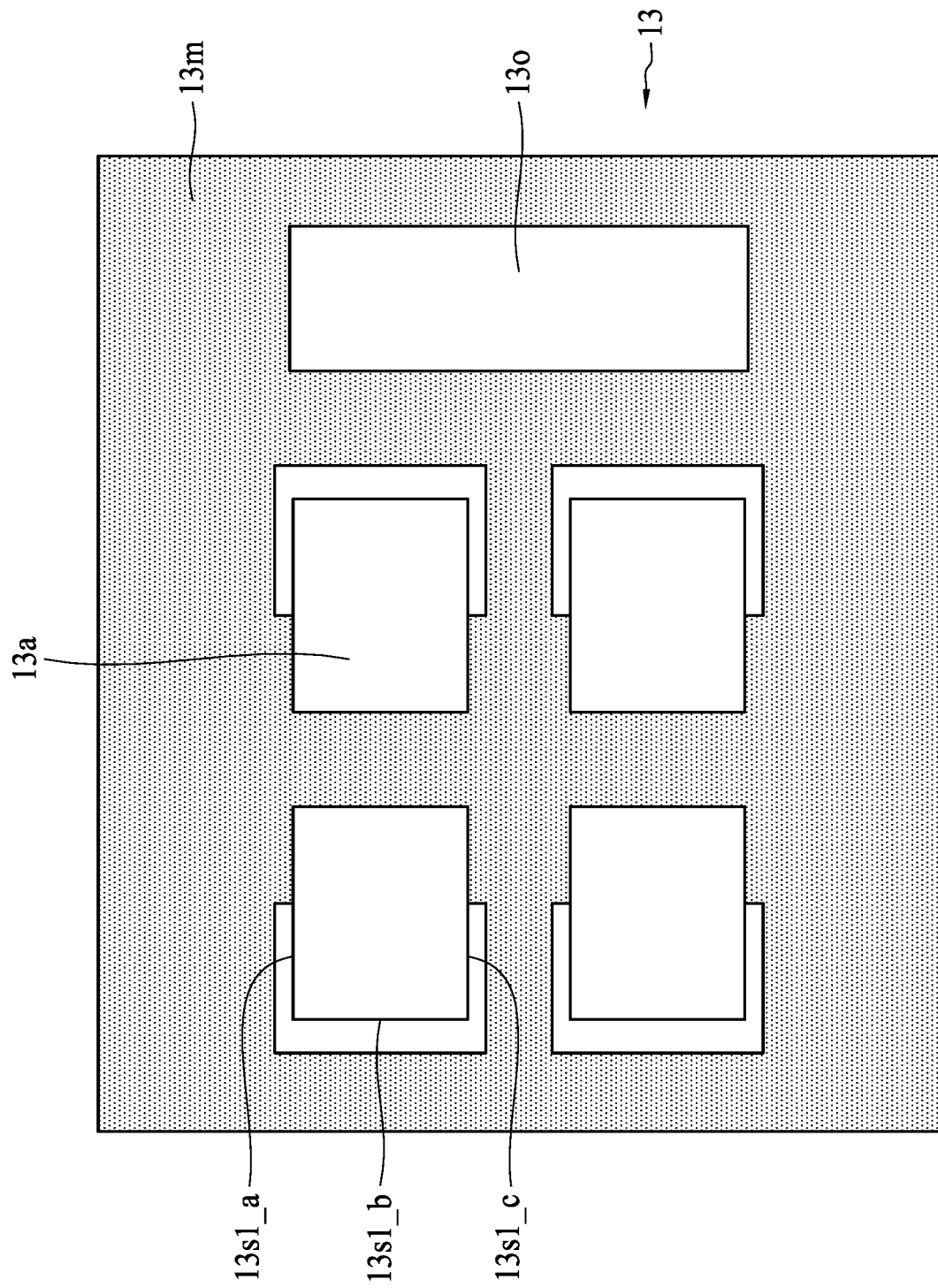
FIG. 6D illustrates a top view of an antenna in accordance with some embodiments of the present disclosure.

FIG. 6D illustrates a top view of an antenna in accordance with some embodiments of the present disclosure.

In some embodiments, FIG. 6D can be a top view of an antenna that is similar to the antenna 13 shown in FIG. 5H. In some embodiments, FIG. 6D can be a top view of an antenna that is different to the antenna 13 shown in FIG. 5H. In some embodiments, FIG. 6D can be a top view of the antenna 13 as shown in FIG. 5H.

Referring to FIG. 6D, the antenna 13 may include one or more antenna patterns 13a. The antenna 13 includes a protection layer 13m. The antenna 13 may include one or more openings 13o. The protection layer 13m covers at least a portion of the antenna pattern 13a. The protection layer 13m surrounds at least a portion of the antenna pattern 13a. The protection layer 13m exposes at least a portion of the antenna pattern 13a.

Referring to FIG. 6D, the antenna pattern 13a may include one or more surfaces that are not covered by the protection layer 13m. The antenna pattern 13a may include one or more surfaces that are exposed by the protection layer 13m. The antenna pattern 13a may include one or more surfaces exposed to air. The antenna pattern 13a may include one or more surfaces exposed to vacuum.

In some embodiments, the antenna pattern 13a includes surfaces 13s1_a, 13s1_b and 13s1_c that are not covered by the protection layer 13m. In some embodiments, the antenna pattern 13a includes surfaces 13s1_a, 13s1_b and 13s1_c that are exposed by the protection layer 13m. In some embodiments, the antenna pattern 13a includes surfaces 13s1_a, 13s1_b and 13s1_c exposed to air. In some embodiments, the antenna pattern 13a includes surfaces 13s1_a, 13s1_b and 13s1_c exposed to vacuum.

Figure 6E:
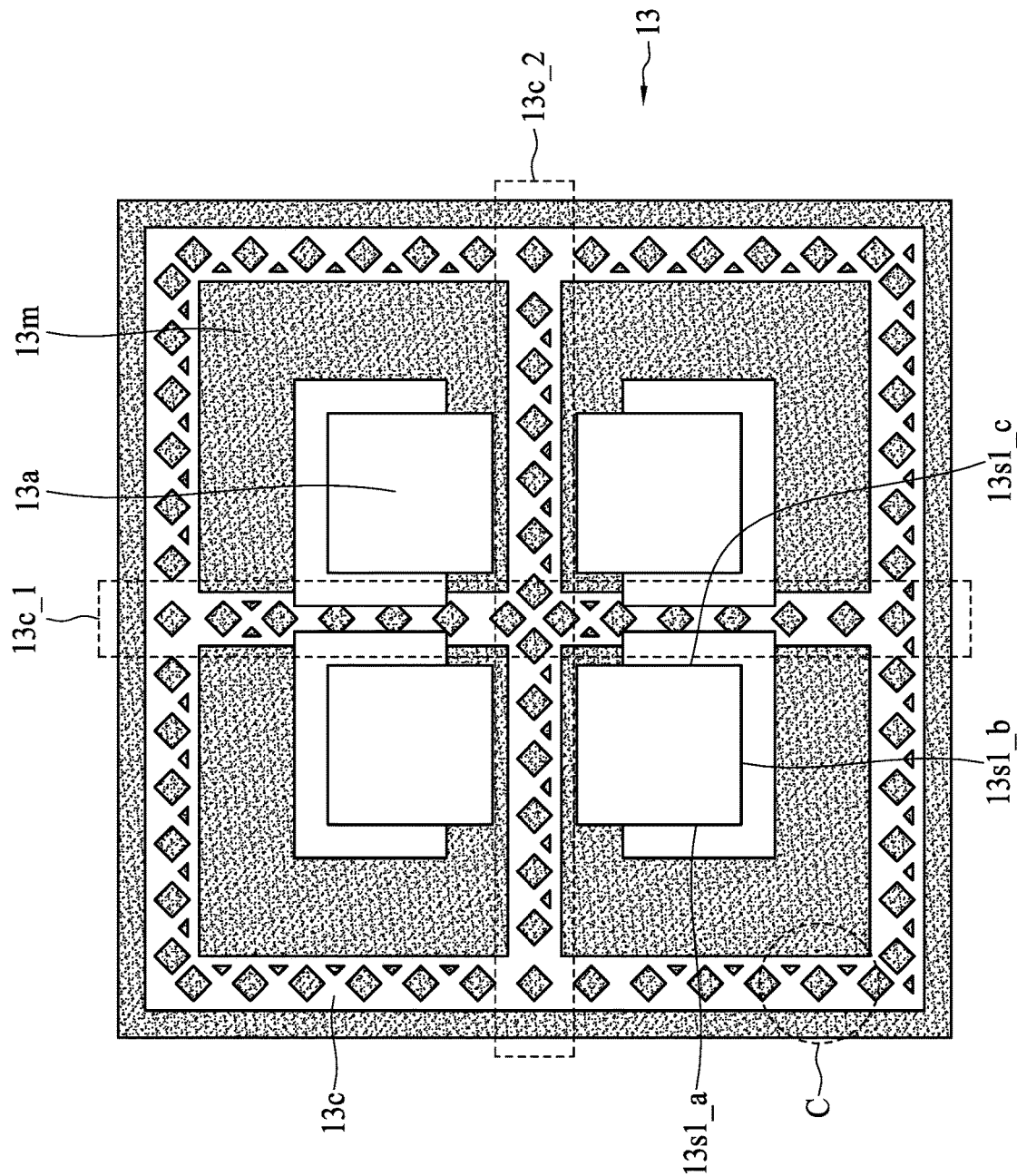
FIG. 6E illustrates a top view of an antenna in accordance with some embodiments of the present disclosure.

FIG. 6E illustrates a top view of an antenna in accordance with some embodiments of the present disclosure.

In some embodiments, FIG. 6E can be a top view of an antenna that is similar to the antenna 13 shown in FIG. 5H. In some embodiments, FIG. 6E can be a top view of an antenna that is different to the antenna 13 shown in FIG. 5H. In some embodiments, FIG. 6E can be a top view of the antenna 13 as shown in FIG. 5H.

Referring to FIG. 6E, the antenna 13 may include one or more antenna patterns 13a. The antenna 13 includes a protection layer 13m. The antenna 13 may include a patterned conductive layer 13c.

The protection layer 13m covers at least a portion of the antenna pattern 13a. The protection layer 13m surrounds at least a portion of the antenna pattern 13a. The protection layer 13m exposes at least a portion of the antenna pattern 13a.

Referring to FIG. 6E, the antenna pattern 13a may include one or more surfaces that are not covered by the protection layer 13m. The antenna pattern 13a may include one or more surfaces that are exposed by the protection layer 13m. The antenna pattern 13a may include one or more surfaces exposed to air. The antenna pattern 13a may include one or more surfaces exposed to vacuum.

In some embodiments, the antenna pattern 13a includes surfaces 13s1_a, 13s1_b and 13s1_c that are not covered by the protection layer 13m. In some embodiments, the antenna pattern 13a includes surfaces 13s1_a, 13s1_b and 13s1_c that are exposed by the protection layer 13m. In some embodiments, the antenna pattern 13a includes surfaces 13s1_a, 13s1_b and 13s1_c exposed to air. In some embodiments, the antenna pattern 13a includes surfaces 13s1_a, 13s1_b and 13s1_c exposed to vacuum.

Referring to FIG. 6E, the patterned conductive layer 13c may include diamond-shaped patterns, as shown in the dotted-circle C. In some embodiments, the patterned conductive layer 13c may include patterns of any other suitable shapes. Some of the patterns of the patterned conductive layer 13c may act as a conductive pad. Some of the patterns of the patterned conductive layer 13c may act as a feeding element for transmitting/receiving signals to/from the antenna 13.

Referring to FIG. 6E, the patterned conductive layer 13c may surround four edges of the antenna 13. The patterned conductive layer 13c may include a portion 13c_1 passing across the antenna 13 from the top to the bottom. The patterned conductive layer 13c may include a portion 13c_2 passing across the antenna 13 from the left side to the right side.

In some embodiments, the diamond-shaped patterns of the patterned conductive layer 13c may prevent a warpage produced in the manufacturing process of the antenna 13. In some embodiments, the patterned conductive layer 13c may prevent a warpage produced in the manufacturing process of the antenna 13 by surrounding the four edges of the antenna 13. In some embodiments, the portion 13c_1 of the patterned conductive layer 13c may prevent a warpage produced in the manufacturing process of the antenna 13. In some embodiments, the portion 13c_2 of the patterned conductive layer 13c may prevent a warpage produced in the manufacturing process of the antenna 13.

FIGS. 7A, 7B, 7C, 7D, 7E and 7F are cross-sectional views of an antenna fabricated at various stages, in accordance with some embodiments of the present disclosure. Various figures have been simplified for a better understanding of the aspects of the present disclosure. In some embodiments, the operations shown in FIGS. 7A, 7B, 7C, 7D, 7E and 7F are a method for manufacturing the antennas 12 or 13 shown in FIG. 2A, 3A or FIG. 5A. Alternatively, the operations shown in FIGS. 7A, 7B, 7C, 7D, 7E and 7F are a method for manufacturing other antennas.

Figure 7A:
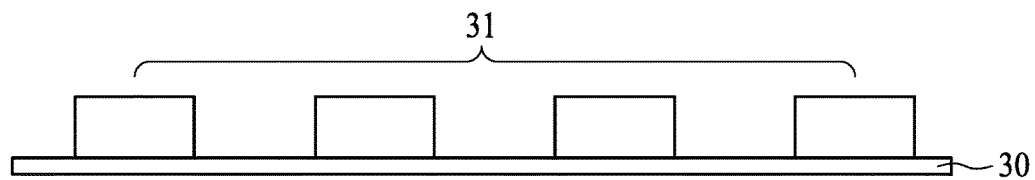
FIG. 7A, FIG. 7B, FIG. 7C, FIG. 7D, FIG. 7E and FIG. 7F are cross-sectional views of an antenna fabricated at various stages, in accordance with some embodiments of the present disclosure.

Referring to FIG. 7A, a carrier 30 is provided. The carrier 30 may be a metal plate, such as a copper plate. An antenna pattern 31 is formed on the carrier 30. In some embodiments, the antenna pattern 31 is formed by, for example, sputtering, coating, electroplating or any other suitable operations.

Figure 7B:
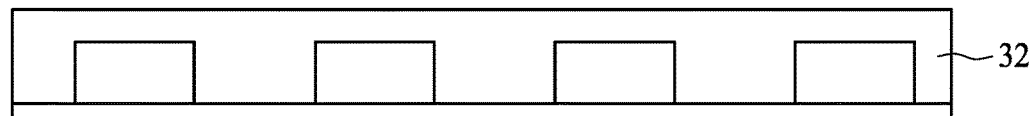

Referring to FIG. 7B, a protection layer 32 is formed on the carrier 30 to cover or encapsulate the antenna pattern 31. The protection layer 32 fully covers or encapsulates the antenna pattern 31. For example, the protection layer 32 is formed on exterior surfaces of the antenna pattern 31 and within gaps defined by the antenna pattern 31.

The protection layer 32 is an insulation layer formed of or includes a dielectric material. For example, the protection layer 32 may include molding compounds, pre-impregnated composite fibers (e.g., pre-preg), BPS), silicon oxide, silicon nitride, silicon oxynitride, USG, any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, the protection layer 32 can be formed by molding, lamination, screening or any other suitable techniques.

Figure 7C:
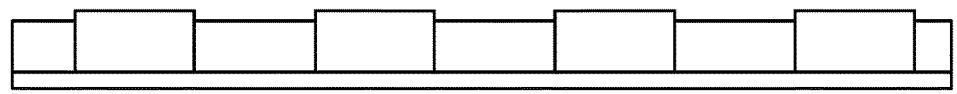

Referring to FIG. 7C, a portion of the protection layer 32 is removed to expose a top surface of the antenna pattern 31. In some embodiments, the top surface of the antenna pattern 31 is substantially coplanar with a top surface of the protection layer 32. In some embodiments, the top surface of the antenna pattern 31 recesses from a top surface of the protection layer 32. In some embodiments, the top surface of the antenna pattern 31 protrudes beyond a top surface of the protection layer 32.

In some embodiments, the portion of the protection layer 32 is removed by, for example, etching, grinding, laser or any other suitable operations. In other embodiments, the carrier 30 can be removed after the operation illustrated in FIG. 7C.

Figure 7D:
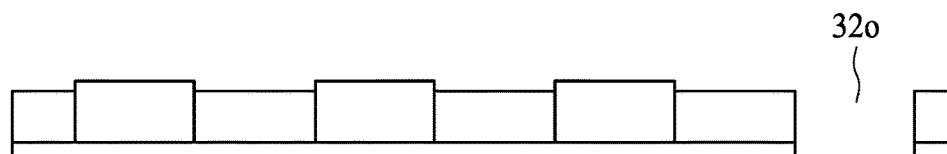

Referring to FIG. 7D, a portion of the antenna pattern 31 and a portion of the carrier 30 are removed to form an opening 32o. The opening 32o penetrates the protection layer 32 and the carrier 30. The opening 32o penetrates from the top surface of the protection layer 32 to the bottom surface of the carrier 30. The opening 32o is formed by, for example, etching, grinding, laser or any other suitable operations.

Figure 7E:
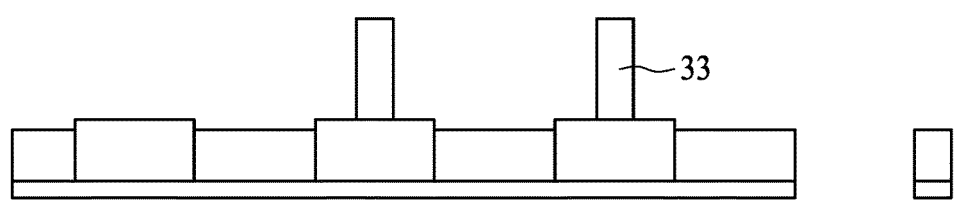

Referring to FIG. 7E, one or more connection structures 33 are formed on the antenna pattern 31 by, for example, electroplating, wire bonding or any other suitable operations. The connection structures 33 may include, but not limited to, Cu pillars, bonding wires or any other suitable connection elements.

Figure 7F:
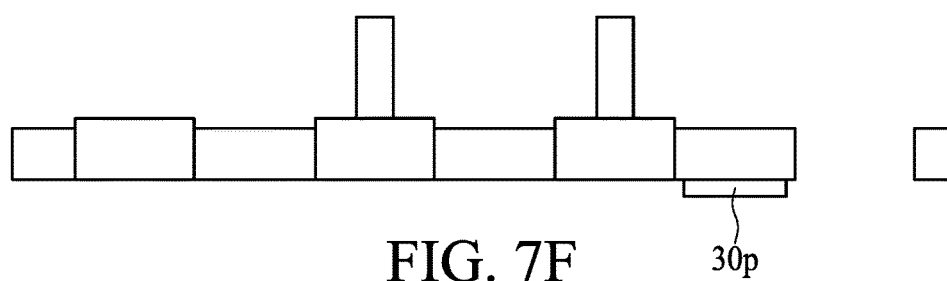

Referring to FIG. 7F, the carrier 30 is removed from the antenna pattern 31 and the protection layer 32 to expose a bottom surface of the antenna pattern 31. In some embodiments, the carrier 30 may be removed completely. In some embodiments, a portion of the carrier 30 remains on the bottom surface of the protection layer 32. In some embodiments, a portion of the carrier 30 remains on the bottom surface of the antenna pattern 31. In some embodiments, a pattern 30p remains on the bottom surface of the protection layer 32. The pattern 30p may be used, but not limited to, signal transmission, electromagnetic wave transmission or electricity transmission.

FIGS. 8A, 8B, 8C, 8D, 8E and 8F are cross-sectional views of an antenna fabricated at various stages, in accordance with some embodiments of the present disclosure. Various figures have been simplified for a better understanding of the aspects of the present disclosure. In some embodiments, the operations shown in FIGS. 8A, 8B, 8C, 8D, 8E and 8F are a method for manufacturing the antennas 12 or 13 shown in FIG. 2A, 3A or FIG. 5A. Alternatively, the operations shown in FIGS. 8A, 8B, 8C, 8D, 8E and 8F are a method for manufacturing other antennas.

Figure 8A:
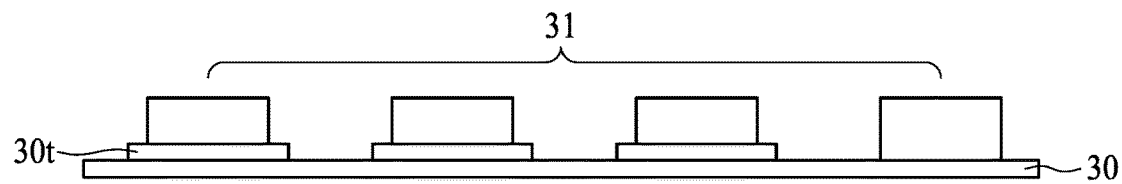
FIG. 8A, FIG. 8B, FIG. 8C, FIG. 8D, FIG. 8E and FIG. 8F are cross-sectional views of an antenna fabricated at various stages, in accordance with some embodiments of the present disclosure.

Referring to FIG. 8A, a carrier 30 is provided. The carrier 30 may be a metal plate, such as a copper plate. A patterned conductive layer 30t is formed on the carrier. A portion of an antenna pattern 31 is formed on the patterned conductive layer 30t. A portion of the antenna pattern 31 is formed on the carrier 30. The patterned conductive layer 30t is also referred to as a protruding structure 30t in the previous paragraphs.

In some embodiments, the patterned conductive layer 30t is formed by, for example, sputtering, coating, electroplating or any other suitable operations. In some embodiments, the antenna pattern 31 is formed by, for example, sputtering, coating, electroplating or any other suitable operations.

The protruding structure 30t is mechanically attached to the antenna pattern 31. The protruding structure 30t is electrically connected to the antenna pattern 31. In some embodiments, a thickness of the antenna pattern 31 is greater than a thickness of the patterned conductive layer 30t. In some embodiments, a thickness of the antenna pattern 31 is substantially identical to a thickness of the patterned conductive layer 30t. In some embodiments, a thickness of the antenna pattern 31 is less than a thickness of the patterned conductive layer 30t.

Figure 8B:
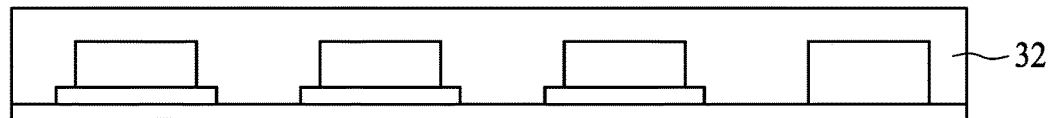

Referring to FIG. 8B, a protection layer 32 is formed on the carrier 30 to cover or encapsulate the antenna pattern 31 and the patterned conductive layer 30t. The protection layer 32 fully covers or encapsulates the antenna pattern 31. The protection layer 32 fully covers or encapsulates the patterned conductive layer 30t. For example, the protection layer 32 is formed on exterior surfaces of the antenna pattern 31 and within gaps defined by the antenna pattern 31. The protection layer 32 is formed on exterior surfaces of the patterned conductive layer 30t and within gaps defined by the patterned conductive layer 30t.

The protection layer 32 is an insulation layer formed of or includes a dielectric material. For example, the protection layer 32 may include molding compounds, pre-impregnated composite fibers (e.g., pre-preg), BPS, silicon oxide, silicon nitride, silicon oxynitride, USG, any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, the protection layer 32 can be formed by molding, lamination, screening or any other suitable techniques.

Figure 8C:
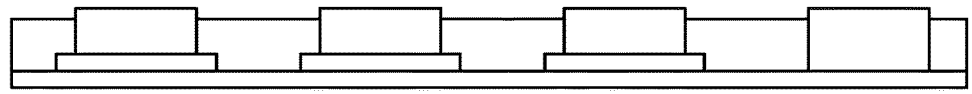

Referring to FIG. 8C, a portion of the protection layer 32 is removed to expose a top surface of the antenna pattern 31. In some embodiments, the top surface of the antenna pattern 31 is substantially coplanar with a top surface of the protection layer 32. In some embodiments, the top surface of the antenna pattern 31 recesses from a top surface of the protection layer 32. In some embodiments, the top surface of the antenna pattern 31 protrudes beyond a top surface of the protection layer 32.

In some embodiments, the portion of the protection layer 32 is removed by, for example, etching, grinding, laser or any other suitable operations. In other embodiments, the carrier 30 can be removed after the operation illustrated in FIG. 8C.

Figure 8D:
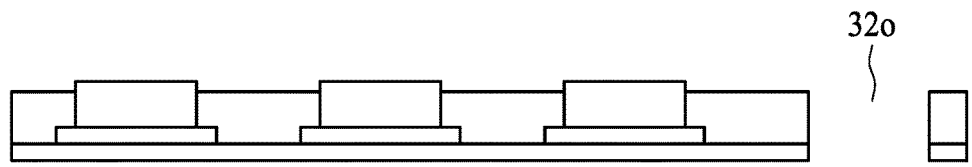

Referring to FIG. 8D, a portion of the antenna pattern 31 and a portion of the carrier 30 are removed to form an opening 32o. The opening 32o penetrates the protection layer 32 and the carrier 30. The opening 32o penetrates from the top surface of the protection layer 32 to the bottom surface of the carrier 30. The opening 32o is formed by, for example, etching, grinding, laser or any other suitable operations.

Figure 8E:
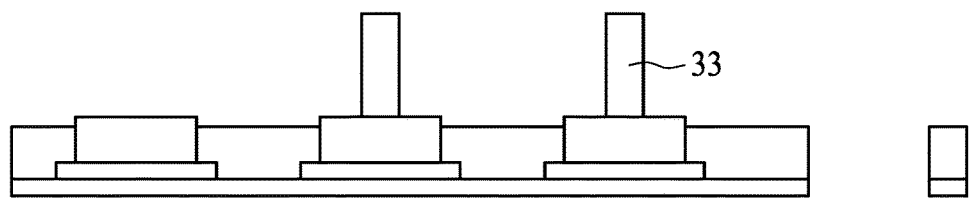

Referring to FIG. 8E, one or more connection structures 33 are formed on the antenna pattern 31 by, for example, electroplating, wire bonding or any other suitable operations. The connection structures 33 may include, but not limited to, Cu pillars, bonding wires or any other suitable connection elements.

Figure 8F:
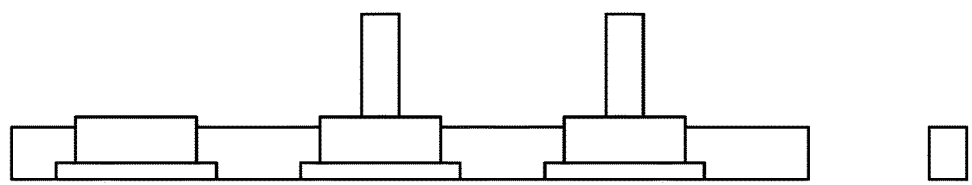

Referring to FIG. 8F, the carrier 30 is removed from the antenna pattern 31 and the protection layer 32 to expose a bottom surface of the pattern conductive layer 30t. In some embodiments, the carrier 30 may be removed completely. In some embodiments, a portion of the carrier 30 remains on the bottom surface of the protection layer 32 (not shown). In some embodiments, a portion of the carrier 30 remains on the bottom surface of the pattern conductive layer 30t (not shown).

FIGS. 9A, 9B, 9C, 9D and 9E are cross-sectional views of an antenna fabricated at various stages, in accordance with some embodiments of the present disclosure. Various figures have been simplified for a better understanding of the aspects of the present disclosure. In some embodiments, the operations shown in FIGS. 9A, 9B, 9C, 9D and 9E are a method for manufacturing the antennas 12 or 13 shown in FIG. 2A, 3A or FIG. 3C. Alternatively, the operations shown in FIGS. 9A, 9B, 9C, 9D and 9E are a method for manufacturing other antennas.

Figure 9A:
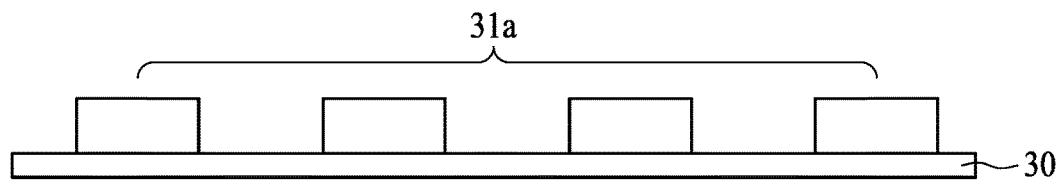
FIG. 9A, FIG. 9B, FIG. 9C, FIG. 9D and FIG. 9E are cross-sectional views of an antenna fabricated at various stages, in accordance with some embodiments of the present disclosure.

Referring to FIG. 9A, a carrier 30 is provided. The carrier 30 may be a metal plate, such as a copper plate. An antenna pattern 31a is formed on the carrier 30. In some embodiments, the antenna pattern 31a is formed by, for example, sputtering, coating, electroplating or any other suitable operations.

Figure 9B:
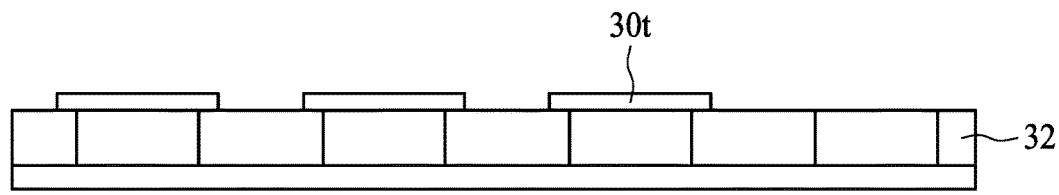

Referring to FIG. 9B, a protection layer 32 is formed on the carrier 30 to cover or encapsulate the antenna pattern 31a and the patterned conductive layer 30t. The protection layer 32 fully covers or encapsulates the antenna pattern 31a. For example, the protection layer 32 is formed on exterior surfaces of the antenna pattern 31a and within gaps defined by the antenna pattern 31a.

Referring to FIG. 9B, a patterned conductive layer 30t is formed on the antenna pattern 31a. A portion of the antenna pattern 31a is covered by the patterned conductive layer 30t. A portion of the antenna pattern 31a is exposed by the patterned conductive layer 30t. The patterned conductive layer 30t is also referred to as a protruding structure 30t in the previous paragraphs.

Figure 9C:
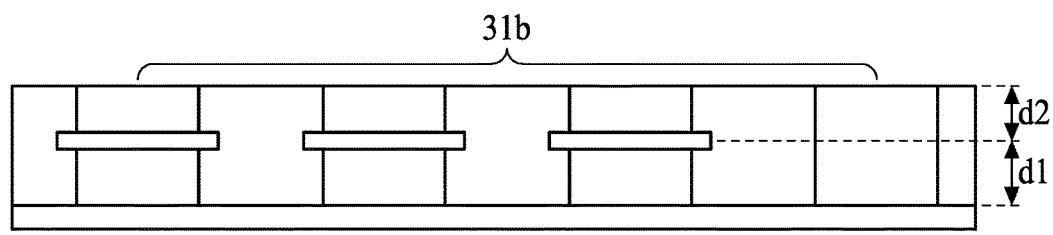

Referring to FIG. 9C, an antenna pattern 31b is formed on the antenna pattern 31a. In some embodiments, the antenna pattern 31b is aligned with the antenna pattern 31a in a direction parallel to the top surface of the carrier 30. In some embodiments, the antenna pattern 31b may be shifted with respect to the antenna pattern 31a by a distance in a direction parallel to the top surface of the carrier 30.

Referring to FIG. 9C, a protection layer 32 is formed to cover or encapsulate the antenna pattern 31b and the patterned conductive layer 30t. The protection layer 32 fully covers or encapsulates the lateral surfaces of the antenna pattern 31b. For example, the protection layer 32 is formed on lateral surfaces of the antenna pattern 31b and within gaps defined by the antenna pattern 31b. The protection layer 32 exposes the top surface of the antenna pattern 31b.

Referring to FIG. 9C, the patterned conductive layer 30t extends from the lateral surfaces of the antenna patterns 31b into the protection layer 32. The patterned conductive layer 30t is spaced apart from the bottom surface of the antenna pattern 31a by a distance d1. The patterned conductive layer 30t is spaced apart from the top surface of the antenna pattern 31b by a distance d2. In some embodiments, the distance d1 is substantially identical to the distance d2. In some embodiments, the distance d1 is less than the distance d2. In some embodiments, the distance d1 is greater than the distance d2.

The antenna pattern 31a and the antenna pattern 31b can be collectively referred to as antenna pattern 31.

Figure 9D:
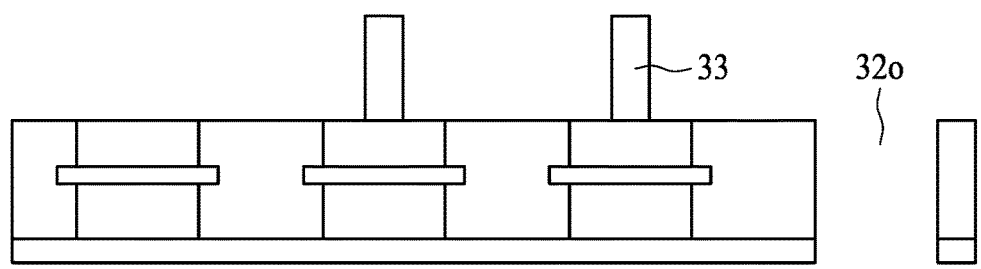

Referring to FIG. 9D, a portion of the antenna pattern 31 and a portion of the carrier 30 are removed to form an opening 32o. The opening 32o penetrates the protection layer 32 and the carrier 30. The opening 32o penetrates from the top surface of the protection layer 32 to the bottom surface of the carrier 30. The opening 32o is formed by, for example, etching, grinding, laser or any other suitable operations.

Referring to FIG. 9D, one or more connection structures 33 are formed on the antenna pattern 31 by, for example, electroplating, wire bonding or any other suitable operations. The connection structures 33 may include, but not limited to, Cu pillars, bonding wires or any other suitable connection elements.

Figure 9E:
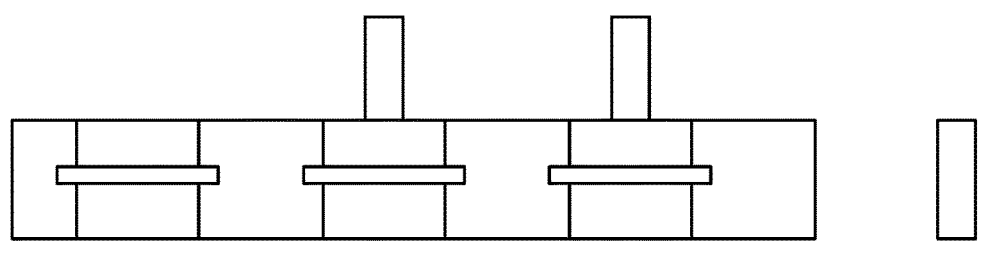

Referring to FIG. 9E, the carrier 30 is removed from the antenna pattern 31 and the protection layer 32 to expose a bottom surface of the antenna pattern 31. In some embodiments, the carrier 30 may be removed completely. In some embodiments, a portion of the carrier 30 remains on the bottom surface of the protection layer 32 (not shown). In some embodiments, a portion of the carrier 30 remains on the bottom surface of the antenna pattern 31 (not shown).

FIGS. 11A, 11B, 11C, 11D, 11E, 11F, 11G, 11H, 11I, 11J and 11K are cross-sectional views of a semiconductor device package fabricated at various stages, in accordance with some embodiments of the present disclosure. Various figures have been simplified for a better understanding of the aspects of the present disclosure. In some embodiments, the operations shown in FIGS. 11A, 11B, 11C, 11D, 11E, 11F, 11G, 11H, 11I, 11J and 11K are a method for manufacturing the semiconductor device package shown in FIG. 4A or 4B. Alternatively, the operations shown in FIGS. 11A, 11B, 11C, 11D, 11E, 11F, 11G, 11H, 11I, 11J and 11K are a method for manufacturing other semiconductor device package.

Figure 11A:
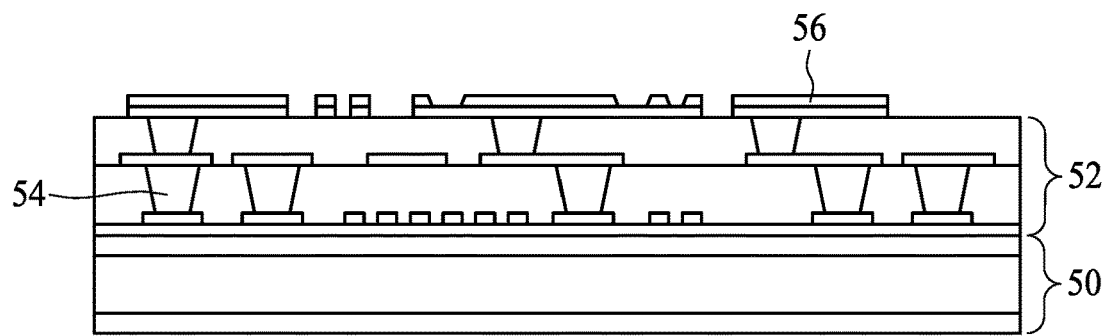
FIG. 11A, FIG. 11B, FIG. 11C, FIG. 11D, FIG. 11E, FIG. 11F, FIG. 11G, FIG. 11H, FIG. 11I, FIG. 11J and FIG. 11K are cross-sectional views of a semiconductor device package fabricated at various stages, in accordance with some embodiments of the present disclosure.

Referring to FIG. 11A, a semiconductor device package is provided. The semiconductor device package includes a substrate 50 and a package body 52 disposed above or covers the substrate 50. In some embodiments, the substrate 50 is a single-layered substrate. In some embodiments, the substrate 50 is a multi-layered substrate.

The substrate 50 may be, for example, a printed circuit board, such as a paper-based copper foil laminate, a composite copper foil laminate, or a polymer-impregnated glass-fiber-based copper foil laminate. The substrate 50 may include an interconnection structure, such as a redistribution layer (RDL) or a grounding element.

In some embodiments, the package body 52 includes an epoxy resin having fillers, a molding compound (e.g., an epoxy molding compound or other molding compound), a polyimide, a phenolic compound or material, a material with a silicone dispersed therein, or a combination thereof. The package body 52 may include an interconnection structure 56, such as a redistribution layer (RDL) disposed within or above the package body 52. The package body 52 may include a conducting element 54, such as a conductive via disposed within or above the package body 52.

Figure 11B:
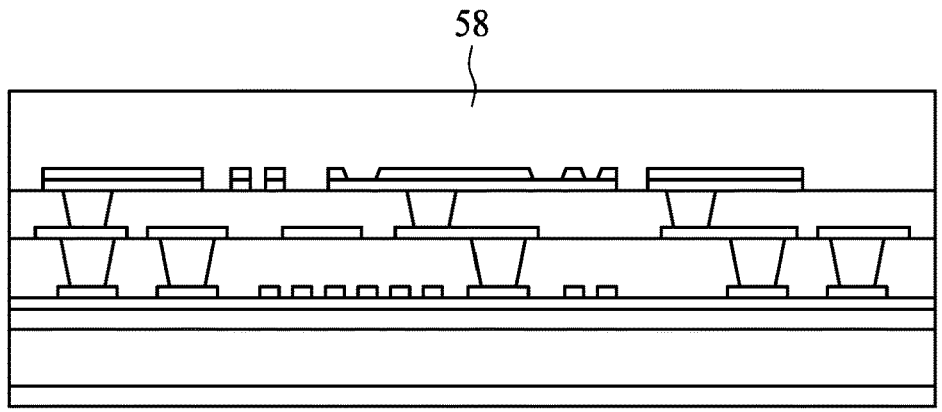

Referring to FIG. 11B, a protection layer 58 is provided above the package body 52. The protection layer 58 covers or encapsulates the package body 52. The protection layer 58 covers or encapsulates the interconnection structure 56. In some embodiments, the protection layer 58 may include insulation materials. In some embodiments, the protection layer 58 may include photo sensitive materials, such as photo-imageable dielectric (PID). In some embodiments, the protection layer 58 includes a dielectric material. For example, the protection layer 58 may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets.

Figure 11C:
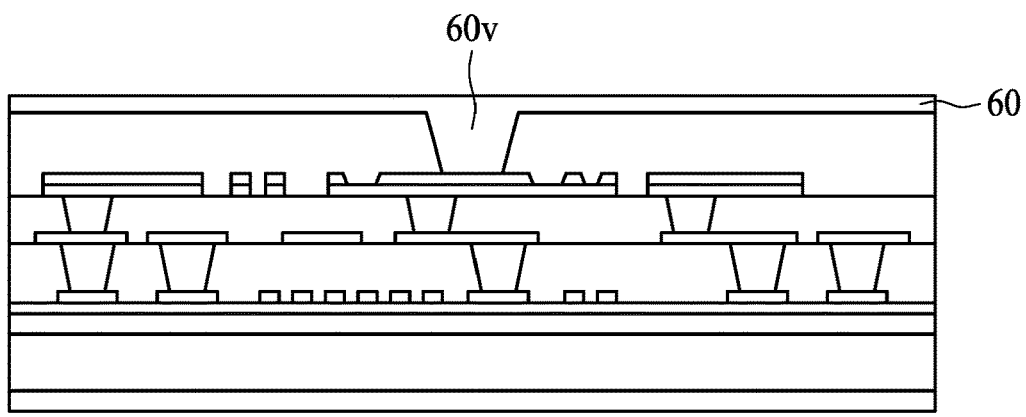

Referring to FIG. 11C, a metal layer 60 is provided above the protection layer 58. The metal layer 60 may include an interconnection structure 60v surrounded by the protection layer 58. The metal layer 60 may include an interconnection structure 60v embedded within the protection layer 58. The metal layer 60 may include, for example, aluminum (Al), copper (Cu), chromium (Cr), tin (Sn), gold (Au), silver (Ag), nickel (Ni) or stainless steel, or a mixture, an alloy, or other combination thereof.

Figure 11D:
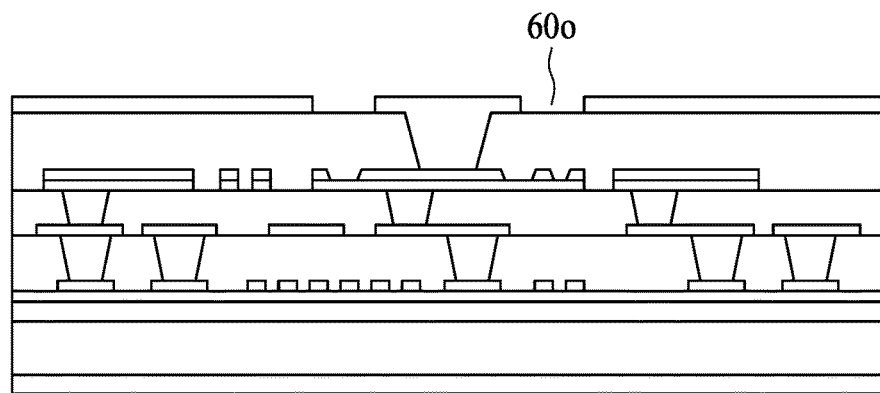

Referring to FIG. 11D, an opening 60o is formed on the metal layer 60. In some embodiments, the opening 60o may be formed by a process that includes the following operations: (i) forming a photoresist or mask on the metal layer 60; (ii) defining a predetermined pattern on the photoresist or mask by, for example, lithographic technique; (iii) plating or etching conductive material to form the opening 60o; and (iv) removing the photoresist or mask.

Figure 11E:
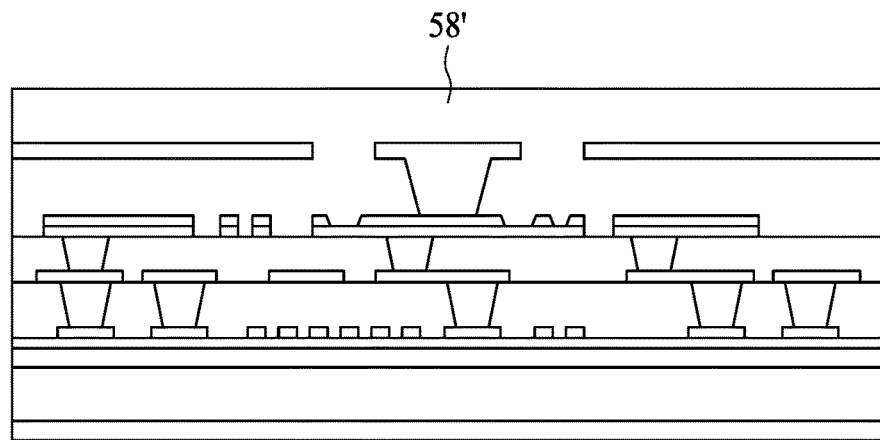

Referring to FIG. 11E, a protection layer 58' is provided above the metal layer 60. The protection layer 58' covers or encapsulates the metal layer 60. The protection layer 58 covers or encapsulates the interconnection structure 60v. In some embodiments, the protection layer 58' includes material similar to that of the protection layer 58. In some embodiments, the protection layer 58' includes material identical to that of the protection layer 58. In some embodiments, the protection layer 58' includes material different from that of the protection layer 58.

Figure 11F:
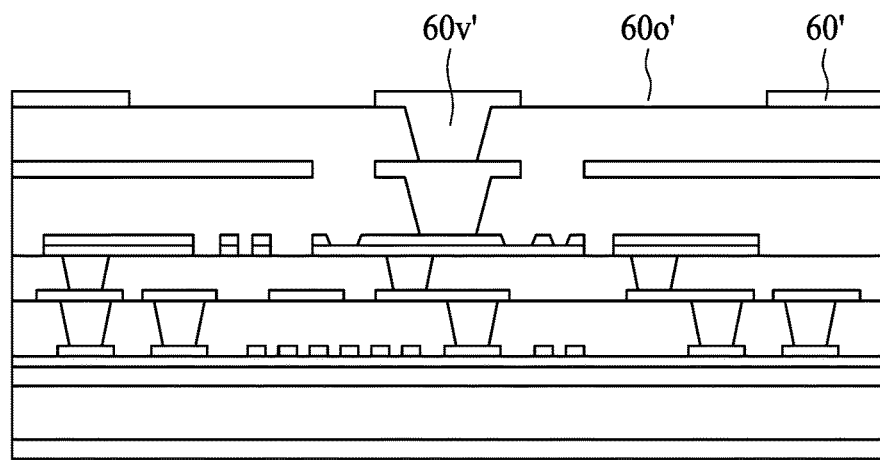

Referring to FIG. 11F, a metal layer 60' is provided above the protection layer 58'. The metal layer 60' may include an interconnection structure 60v' surrounded by the protection layer 58'. The metal layer 60' may include an interconnection structure 60v' embedded within the protection layer 58'. In some embodiments, the metal layer 60' includes material similar to that of the metal layer 60. In some embodiments, the metal layer 60' includes material identical to that of the metal layer 60. In some embodiments, the metal layer 60' includes material different from that of the metal layer 60.

Referring to FIG. 11F, an opening 60o' is formed on the metal layer 60'. In some embodiments, the opening 60o' may be formed by a process that includes the following operations: (i) forming a photoresist or mask on the metal layer 60'; (ii) defining a predetermined pattern on the photoresist or mask by, for example, lithographic technique; (iii) plating or etching conductive material to form the opening 60o'; and (iv) removing the photoresist or mask.

Figure 11G:
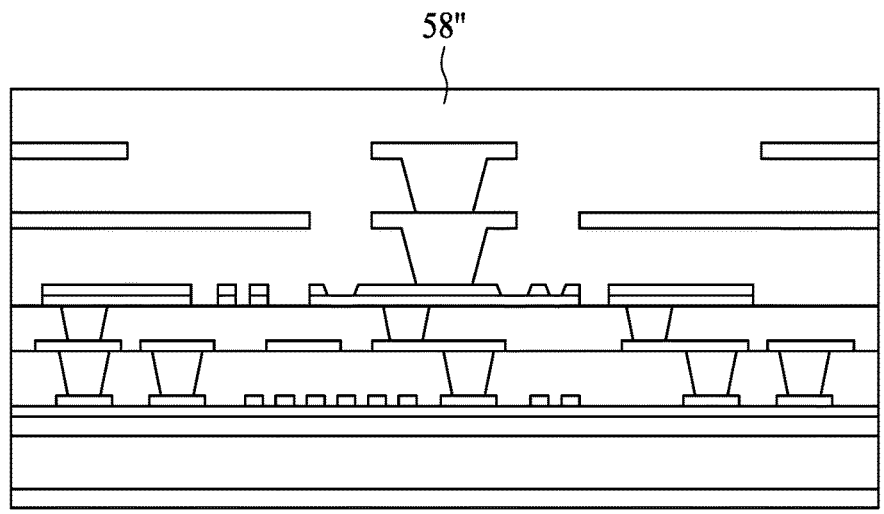

Referring to FIG. 11G, a protection layer 58" is provided above the metal layer 60'. The protection layer 58" covers or encapsulates the metal layer 60'. The protection layer 58" covers or encapsulates the interconnection structure 60v'. In some embodiments, the protection layer 58" includes material similar to that of the protection layer 58. In some embodiments, the protection layer 58" includes material identical to that of the protection layer 58. In some embodiments, the protection layer 58" includes material different from that of the protection layer 58.

Figure 11H:
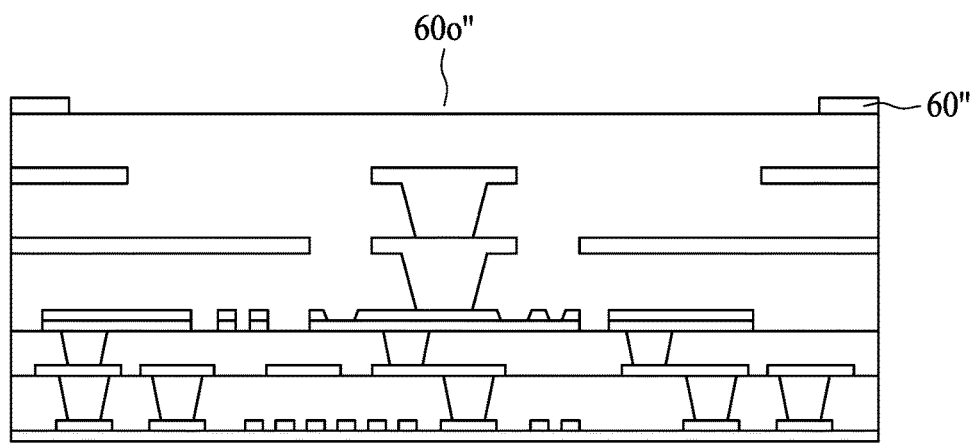

Referring to FIG. 11H, a metal layer 60" is provided above the protection layer 58". In some embodiments, the metal layer 60" includes material similar to that of the metal layer 60. In some embodiments, the metal layer 60" includes material identical to that of the metal layer 60. In some embodiments, the metal layer 60" includes material different from that of the metal layer 60.

Referring to FIG. 11H, an opening 60o" is formed on the metal layer 60". In some embodiments, the opening 60o" may be formed by a process that includes the following operations: (i) forming a photoresist or mask on the metal layer 60"; (ii) defining a predetermined pattern on the photoresist or mask by, for example, lithographic technique; (iii) plating or etching conductive material to form the opening 60o"; and (iv) removing the photoresist or mask.

Figure 11I:
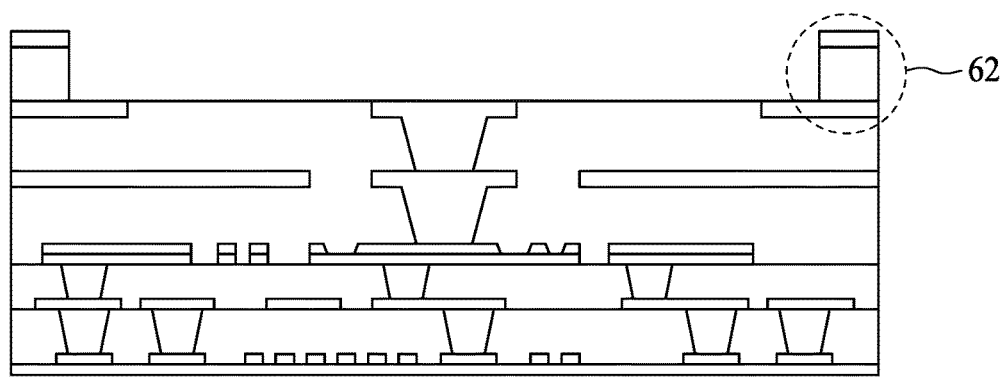

Referring to FIG. 11I, a portion of the protection layer 58" is removed. In some embodiment, a portion of the protection layer 58" which is not covered by the metal layer 60" is removed. In some embodiment, a portion of the protection layer 58" exposed by the opening 60o" is removed. The portion of the protection layer 58" may be removed using, for example, laser, grinding, etching or any other suitable operations. After a portion of the protection layer 58" is removed, a step structure or a ladder structure 62 is formed.

Figure 11J:
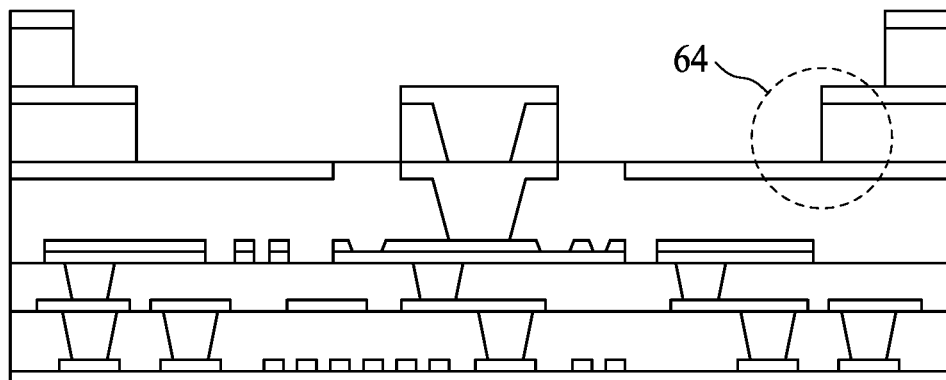

Referring to FIG. 11J, a portion of the protection layer 58' is removed. In some embodiment, a portion of the protection layer 58' which is not covered by the metal layer 60' is removed. In some embodiment, a portion of the protection layer 58' exposed by the opening 60o' is removed. The portion of the protection layer 58' may be removed using, for example, laser, grinding, etching or any other suitable operations. After a portion of the protection layer 58' is removed, a step structure or a ladder structure 64 is formed.

Figure 11K:
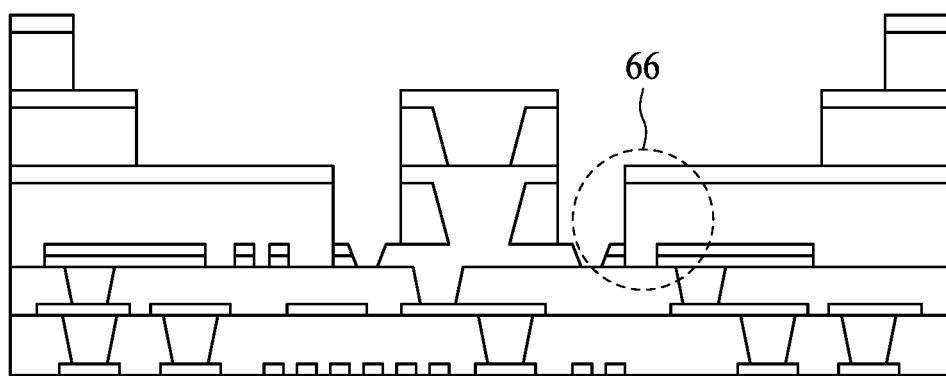

Referring to FIG. 11K, a portion of the protection layer 58 is removed. In some embodiment, a portion of the protection layer 58 which is not covered by the metal layer 60 is removed. In some embodiment, a portion of the protection layer 58 exposed by the opening 60o is removed. The portion of the protection layer 58 may be removed using, for example, laser, grinding, etching or any other suitable operations. After a portion of the protection layer 58 is removed, a step structure or a ladder structure 66 is formed.

FIGS. 10A, 10B, 10C, 10D, 10E, 10F and 10G are cross-sectional views of a semiconductor device package or a portion of the semiconductor device package fabricated at various stages, in accordance with some embodiments of the present disclosure. Various figures have been simplified for a better understanding of the aspects of the present disclosure. In some embodiments, the operations shown in FIGS. 10A, 10B, 10C, 10D, 10E, 10F and 10G are a method for manufacturing the semiconductor device package shown in FIG. 1A or FIG. 2A. Alternatively, the operations shown in FIGS. 10A, 10B, 10C, 10D, 10E, 10F and 10G are a method for manufacturing other semiconductor device packages.

Figure 10A:
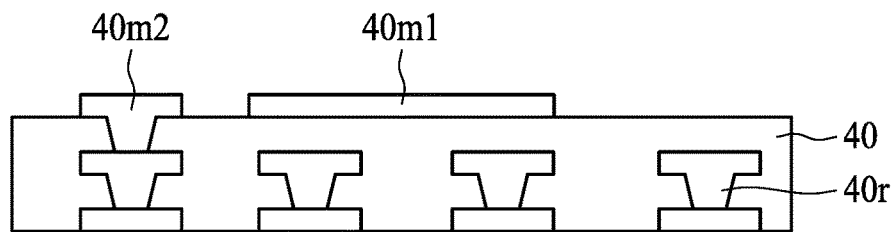
FIG. 10A, FIG. 10B, FIG. 10C, FIG. 10D, FIG. 10E, FIG. 10F and FIG. 10G are cross-sectional views of a semiconductor device package or a portion of the semiconductor device package fabricated at various stages, in accordance with some embodiments of the present disclosure.

Referring to FIG. 10A, a substrate 40 is provided. The substrate 40 may include interconnection structures (RDL) 40r covered or encapsulate by dielectric layers. The substrate 40 may include a conductive layer 40m1 and a conductive pad 40m2 on a top surface of the substrate 40. In some embodiments, the conductive layer 40m1 is grounded. In some embodiments, the conductive layer 40m1 is an antenna. In some embodiments, the conductive layer 40m1 is part of an antenna structure. In some embodiment, the conductive pad 40m2 acts as a feeding element for providing signals to an antenna structure. In some embodiment, the conductive pad 40m2 acts as a feeding element for receiving signals from an antenna structure.

Figure 10B:
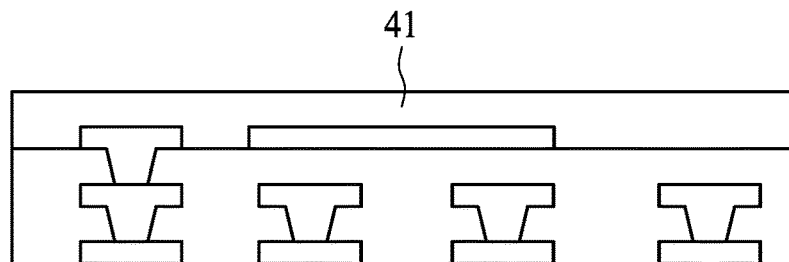

Referring to FIG. 10B, an insulation layer 41 is formed on the top surface of the substrate 40 to cover the conductive layer 40m1, the conductive pad 40m2 and the top surface of the substrate 40. In some embodiments, the insulation layer 41 is formed of or includes PID, polyimide (PI) or solder resist. In some embodiments, the insulation layer 41 can be formed by, for example, lamination or other suitable operations.

Figure 10C:
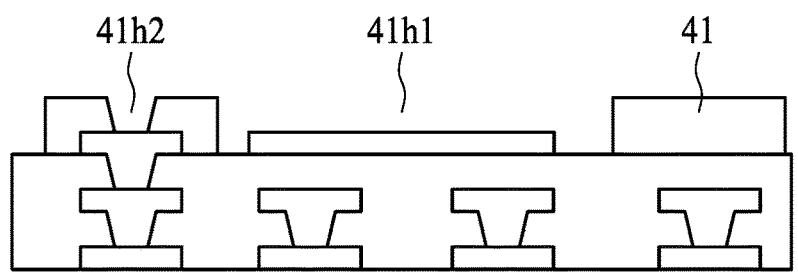

Referring to FIG. 10C, a portion of the insulation layer 41 is removed to form one or more openings (or cavities) 41h1 and 41h2 to expose the conductive layer 40m1 and the conductive pad 40m2. In some embodiments, the insulation layer 41 is removed by, for example, etching or other suitable operations.

Figure 10D:
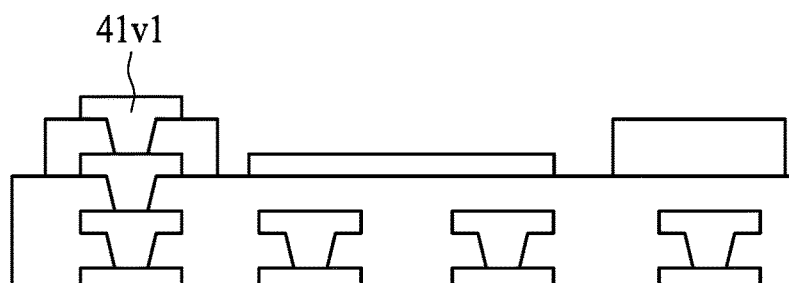

Referring to FIG. 10D, a conductive material is filled within the opening 41h2 to form a conductive via 41v1. In some embodiments, the conductive via 41v1 is formed by plating or other suitable operations. The conductive via 41v1 is in contact with the conductive pad 40m2 on the top surface of the substrate 40. In some embodiments, the conductive via 41v1 and the conductive pad 40m2 are collectively referred to as a feeding element.

Figure 10E:
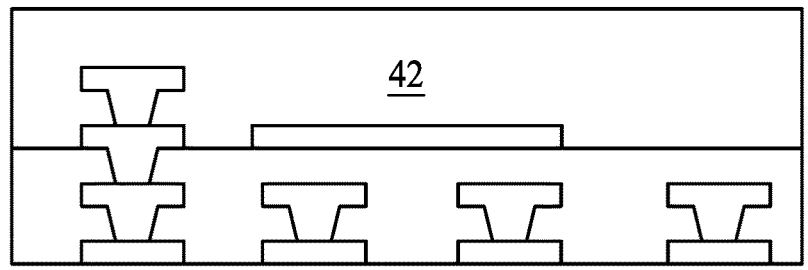

Referring to FIG. 10E, an insulation layer 42 is formed on the insulation layer 41 to cover the conductive via 41v1 and the conductive layer 40m1. In some embodiments, the insulation layer 42 can be formed of or includes PID, PI or solder resist. In some embodiments, the insulation layer 42 can be formed by, for example, lamination or other suitable operations. The insulation layer 42 and the insulation layer 41 can be formed of the same or different materials depending on design specifications.

Figure 10F:
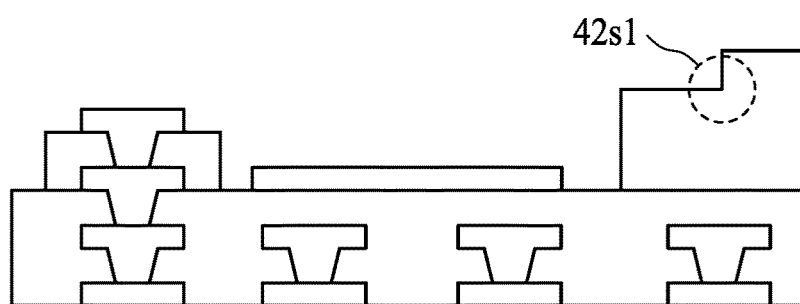

Referring to FIG. 10F, a portion of the insulation layer 42 is removed to form a step structure 42s1 (or ladder structure) and to expose the conductive via 41v1 and the conductive layer 40m1. In some embodiments, the insulation layer 42 can be removed by, for example, etching or other suitable operations.

Figure 10G:
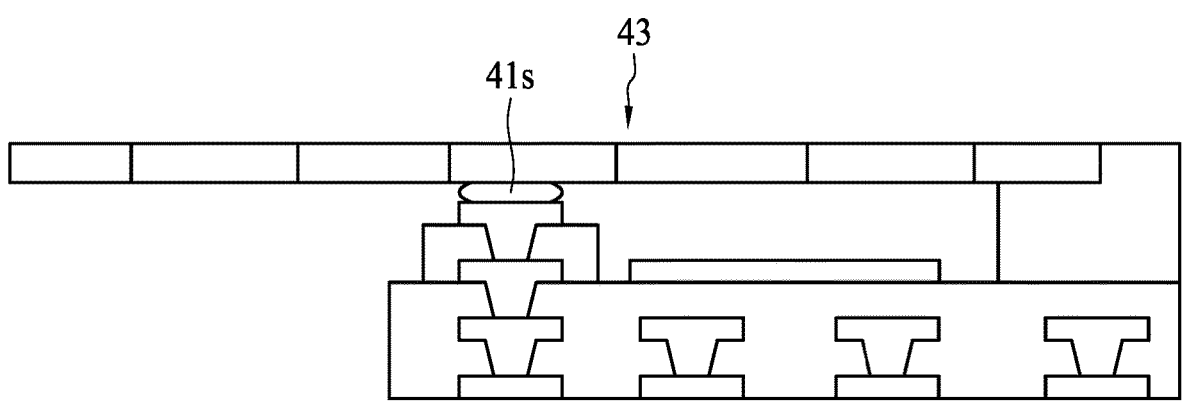

Referring to FIG. 10G, an antenna 43 is placed on the step structure 42s1 of the insulation layer 42 through an adhesive (e.g., conductive adhesive or non-conductive adhesive). The antenna 43 is electrically connected to the conductive via 41v1 through an electrical contact 41s (e.g., a solder ball). In some embodiments, the conductive via 41v1 may act as a feeding point of the antenna 43. In some embodiments, the antenna 43 is similar to the antenna 12 or 13 illustrated in FIG. 2A or FIG. 5A. In some embodiments, the antenna 43 can be formed by the operations illustrated in FIGS. 7A, 7B, 7C, 7D, 7E and 7F. In some embodiments, the antenna 43 can be formed by the operations illustrated in FIGS. 8A, 8B, 8C, 8D, 8E and 8F. In some embodiments, the antenna 43 can be formed by the operations illustrated in FIGS. 9A, 9B, 9C, 9D and 9E.

In some embodiments, the conductive via 41v1 and the electrical contact 41s can be omitted, and the antenna as shown in FIG. 7E is placed on the step structure 42s1 of the insulation layer 42 with the connection structure 33 directly connecting to the conductive pad 40m2.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Ranges can be expressed herein as from one endpoint to another endpoint or between two endpoints. All ranges disclosed herein are inclusive of the endpoints, unless specified otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

For example, two surfaces can be deemed to be coplanar or substantially coplanar if a displacement between the two surfaces is equal to or less than 5 μm, equal to or less than 2 μm, equal to or less than 1 μm, or equal to or less than 0.5 μm. A surface can be deemed to be planar or substantially planar if a displacement of the surface relative to a flat plane between any two points on the surface is equal to or less than 5 μm, equal to or less than 2 μm, equal to or less than 1 μm, or equal to or less than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a substrate;
a first antenna comprising a first antenna pattern and a protection layer in contact with a lateral surface of the first antenna pattern;
a first support structure disposed on the substrate and configured to support the first antenna; and
a second antenna and a second support structure configured to support the second antenna, wherein the first antenna and the second antenna are disposed at different elevation,
wherein the second antenna comprises a first antenna pattern aligned with the first antenna pattern of the first antenna in a direction substantially perpendicular to the substrate, wherein the second antenna has an opening exposing a second antenna pattern of the first antenna.

2. The semiconductor device package of claim 1, wherein the second antenna comprises a protection layer and the opening of the second antenna is defined by the protection layer of the second antenna.

3. The semiconductor device package of claim 1, wherein a projection surface area of the second antenna on the substrate is different from that of the first antenna in a direction substantially perpendicular to the substrate.

4. The semiconductor device package of claim 3, wherein the projection surface area of the second antenna on the substrate is greater than that of the first antenna.

5. The semiconductor device package of claim 1, wherein the second support structure extends from the substrate to the second antenna.

6. The semiconductor device package of claim 1, wherein the second support structure is disposed between the first antenna and the second antenna.

7. The semiconductor device package of claim 1, further comprising a grounding layer disposed on the substrate and aligned with the first antenna pattern of the first antenna.

8. The semiconductor device package of claim 1, wherein the first antenna pattern has a first surface angled with respect to the lateral surface of the first antenna pattern and a second surface opposite to the first surface, wherein at least one of the first surface and the second surface is exposed to air.

9. The semiconductor device package of claim 1, wherein the first antenna further comprises a second antenna pattern, and the protection layer is in contact with a lateral surface of the first antenna pattern of the first antenna and a lateral surface of the second antenna pattern of the first antenna.

10. The semiconductor device package of claim 1, wherein a portion of the lateral surface of the first antenna pattern is exposed from the protection layer.

11. A semiconductor device package, comprising:
a substrate;
a first antenna comprising a first antenna pattern and a protection layer in contact with a lateral surface of the first antenna pattern;
a first support structure disposed on the substrate and configured to support the first antenna; and
a second antenna and a second support structure configured to support the second antenna, wherein the first antenna and the second antenna are disposed at different elevation,
wherein the second antenna comprises a first antenna pattern aligned with the first antenna pattern of the first antenna in a direction substantially perpendicular to the substrate, wherein the first antenna has an opening aligned with a second antenna pattern of the second antenna in a direction substantially perpendicular to the substrate.

12. The semiconductor device package of claim 11, wherein the opening of the first antenna is defined by the protection layer of the first antenna.

* * * * *